(12) United States Patent
Kato

(10) Patent No.: US 8,614,144 B2
(45) Date of Patent: Dec. 24, 2013

(54) METHOD FOR FABRICATION OF INTERCONNECT STRUCTURE WITH IMPROVED ALIGNMENT FOR SEMICONDUCTOR DEVICES

(75) Inventor: Hirokazu Kato, Albany, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 163 days.

(21) Appl. No.: 13/157,744

(22) Filed: Jun. 10, 2011

(65) Prior Publication Data

US 2012/0313251 A1   Dec. 13, 2012

(51) Int. Cl.
   *H01L 21/31*   (2006.01)
   *H01L 21/469*   (2006.01)

(52) U.S. Cl.
   USPC .......................... 438/667; 438/703; 257/773

(58) Field of Classification Search
   USPC ................. 438/667, 703; 257/773, E21.219
   See application file for complete search history.

(56) References Cited

U.S. PATENT DOCUMENTS

| | | | |
|---|---|---|---|
| 6,787,875 B2 | 9/2004 | Brennan et al. | |
| 7,799,517 B1* | 9/2010 | Capodieci | 430/396 |
| 2008/0090419 A1* | 4/2008 | Koh et al. | 438/696 |
| 2009/0146125 A1* | 6/2009 | Ho et al. | 257/2 |
| 2010/0176479 A1* | 7/2010 | Postnikov et al. | 257/499 |
| 2010/0317194 A1* | 12/2010 | Su et al. | 438/694 |
| 2012/0244711 A1* | 9/2012 | Yin et al. | 438/703 |

* cited by examiner

*Primary Examiner* — Phuc Dang
(74) *Attorney, Agent, or Firm* — White & Case LLP

(57) ABSTRACT

Methods and structure are provided for creating and utilizing hard masks to facilitate creation of a grating effect to control an anisotropic etching process for the creation of an opening, and subsequent formation of a interconnect structure (e.g., a via) in a multilayered semiconductor device. A first hard mask can be patterned to control etching in a first dimension, and a second hard mask can be patterned to control etching in a second dimension, wherein the second hard mask is patterned orthogonally opposed to the first hard mask. A resist can be patterned by inverting the pattern of a metal line patterning. Interconnects can be formed with critical dimension(s) and also self-aligned.

10 Claims, 22 Drawing Sheets

METHOD FOR FABRICATION OF INTERCONNECT STRUCTURE WITH IMPROVED ALIGNMENT FOR SEMICONDUCTOR DEVICES

FIELD

Embodiments described herein relate generally to a method of utilizing a plurality of hard masks to control creation of an interconnect structure.

BACKGROUND

Silicon large-scale integrated circuits, among other device technologies, are increasing in use in order to provide support for the advanced information society of the future. An integrated circuit can be composed of a plurality of semiconductor devices, such as transistors or the like, which can be produced according to a variety of techniques. To continuously increase integration and speed of semiconductor devices, a trend of continuously scaling semiconductors (e.g., reducing size and features of semiconductor devices) has emerged. Reducing semiconductor and/or semiconductor feature size provides improved speed, performance, density, cost per unit, etc., of resultant integrated circuits. However, as semiconductor devices and device features have become smaller, conventional fabrication techniques have been limited in their ability to produce finely defined features.

Conventionally, front-end-of-line (FEOL) fabrication processing of an integrated circuit relates to patterning of devices (e.g., transistors, capacitors, resistors, etc.) in the semiconductor. Formation of interconnects to facilitate connection of the various devices conventionally occurs during back-end-of-line (BEOL) fabrication. By way of example, interconnects are formed during BEOL fabrication of an integrated circuit structure to facilitate connection between conductive patterns comprising conductive lines separated by interwiring spacings, and a plurality of interconnect lines, such as bus lines, bit lines, word lines and logic interconnect lines comprising an integrated circuit structure. A particular aspect in interconnect formation is a via, where a via can be formed in an insulator, dielectric, or similar structure, and facilitates connection between the various conductive elements comprising the integrated circuit structure.

Single damascene is an interconnection fabrication process in which grooves are formed in an insulating layer and filled with metal to form the conductive lines. Dual damascene is a multi-level interconnection process in which, in addition to forming the grooves of single damascene, the conductive via openings also are formed. In conventional dual damascene processing, the insulating layer is coated with a resist material which is exposed to a first mask including the image pattern of the via openings, and the pattern is anisotropically etched in the upper half of the insulating layer. After removal of the patterned resist material, the insulating layer is coated with a resist material which is exposed to a second mask with the image pattern of the conductive lines in alignment with the via openings. By anisotropically etching the openings for the conductive lines in the upper half of the insulating material, the via openings already present in the upper half are simultaneously etched in the lower half of the insulating material. After the etching is complete, both the vias and grooves are filled with metal.

Conventionally, by utilizing a dual damascene process, semiconductor devices can be patterned with several thousand openings for conductive lines, interconnects, and vias, which are filled with a conductive metal, such as aluminum or copper, and serve to interconnect the active and/or passive elements of the integrated circuit. The dual damascene process is also used for forming the multilevel signal lines of conductive metal in the insulating layers of multilayer substrate on which semiconductor devices are mounted.

Owing to miniaturization of the semiconductor devices and, accordingly, the conductive elements (e.g., a metal line) located therein, creation of an interconnect(s) in a multilayer semiconductor stack has become an exacting process, pushing the limits of ability for contemporary photolithographic techniques to form an interconnect(s) having the correct dimensions (e.g., critical dimensions) and location in relation to the conductor with which the interconnect is to interface.

As shown in FIG. 20, a plurality of issues relate to the formation of a via having the required critical dimensions and location relative to a conductor, metal line 2010. Via V1 has been formed with a desired critical dimension d, where in this particular example the diameter d of via V1 is less than width W of metal line 2010, and via V1 is aligned correctly with regard to the centerline CL and width W of metal line 2010. V1a V2 has been formed such that via V2 is misaligned with respect to the centerline CL of metal line 2010. As shown, the junction between via V2 and metal line 2010 is not 100%, with a portion of via V2 overhanging metal line 2010, resulting in a contact having detrimental properties compared with via V1, for example via V2 has inferior electrical properties (e.g., inferior current flow) compared with via V1. Via V3 depicts an issue where a current technology, e.g., photolithography, is unable to produce a via having the desired dimension(s) (e.g., critical dimension) with regard to the width W of metal line 2010. Hence, the diameter D of via V3 is greater than width W of metal line 2010, and such an oversize structure can lead to issues such as leakage currents (e.g., tunneling), parasitic capacitance, and the like, with other proximate conductive elements and components. Hence, dimensional control of the via is critical. Accordingly, it would be desirable to form one or more via's correctly aligned with regard to an element (e.g., a metal line) comprising an integrated circuit structure and the via is formed with desired critical dimension(s).

SUMMARY

A simplified summary is provided herein to help enable a basic or general understanding of various aspects of exemplary, non-limiting embodiments that follow in the more detailed description and the accompanying drawings. This summary is not intended, however, as an extensive or exhaustive overview. Instead, the sole purpose of this summary is to present some concepts related to some exemplary non-limiting embodiments in a simplified form as a prelude to the more detailed description of the various embodiments that follow.

A first hard mask and a second hard mask are patterned to form a grating which can be utilized to control formation of an opening in a dielectric material. The material comprising the first hard mask and the second hard mask is selected based upon having a high selectivity to etching, with titanium nitride (TiN) being particularly suitable. The first hard mask layer and second hard mask layer can both be formed by any suitable technique.

The first hard mask and second hard mask are incorporated into formation of a semiconductor stack, comprising a plurality of layers. In an exemplary, non-limiting embodiment, a multilayer stack can comprise of a conductor (e.g., a metal line), dielectric layers, a first hard mask layer, organic film layers, and a second hard mask layer.

During respective processing of the first hard mask and the second hard mask, each mask is patterned such that the patterning of the second hard mask is aligned in orthogonal opposition to the patterning in the first hard mask. In an exemplary, non-limiting embodiment, where the respective patterning of the first hard mask and second hard mask is to control formation of an opening (e.g., for a via which will connect to the conductor) the first hard mask is patterned such that a patterned opening in the first hard mask corresponds with a dimension of the via opening, and with the location of the via opening on the conductor. The second hard mask opening is patterned such that the patterned opening in the second hard mask is orthogonally opposed (e.g., at 90°) to the patterned opening in the first mask, such that when viewed in the etching direction (e.g., into the multilayer stack), the opening in the second patterned hard mask overlays the opening in the first patterned hard mask such that the openings combine to form a grating which will act to control the etching process and also act to self align the opening created therein.

By patterning a first hard mask and second hard mask, as presented with the various exemplary, non-limiting embodiments described herein, it is possible to restrict etching during a lithography process. During an initial etch (e.g., anisotropic) the opening lithography can be relaxed with regard to the final opening dimension, and if real-estate allows (e.g., sufficient distance between the opening and other openings/components) the lithographic overlay specification can be relaxed to be within the general control of the lithographic specification.

In a further exemplary, non-limiting embodiment, a plurality of disparate etching processes (e.g., different etchants) can be utilized to facilitate removal of desired portions of a particular layer while leaving another, disparate layer intact. By employing such selective etch techniques, dielectric, organic film, etc., can be removed as part of fabricating the interconnect opening while portions of a first hard mask and second hard mask are left intact. Hence, by leaving the respective portions of the first hard mask and second hard mask intact, the grating formed by the interaction of the first hard mask and second hard mask can be utilized to control removal of dielectric, organic film, etc., thereby forming an opening (to be subsequently filled during a dual damascene process to form the interconnect) having a desired size (e.g., meets critical dimension requirements) and location with respect to the metal line which the interconnect will be fabricated to connect with.

In a further, non-limiting embodiment, the pattern of the second hard mask can be an inverse of patterning utilized to create the metal line patterning. Accordingly, a via produced with the second patterning will have a critical dimension(s) required for the metal line.

DETAILED DESCRIPTION

Overview of Semiconductor Interconnect Fabrication

The subject innovation provides a technique for utilizing a plurality of patterned hard masks to facilitate fabrication of an interconnect, via, or other element, employed to facilitate interconnection of various elements (e.g., metal lines) comprising a multilayer stack, wherein the interconnect(s), etc. can be formed during a BEOL process. The hard masks are respectively patterned with openings aligned orthogonally opposed to each other, and when combined in the etching direction act as a grating to limit an amount of material removed to create an opening utilized in the fabrication of the interconnect, etc.

Figure 20:
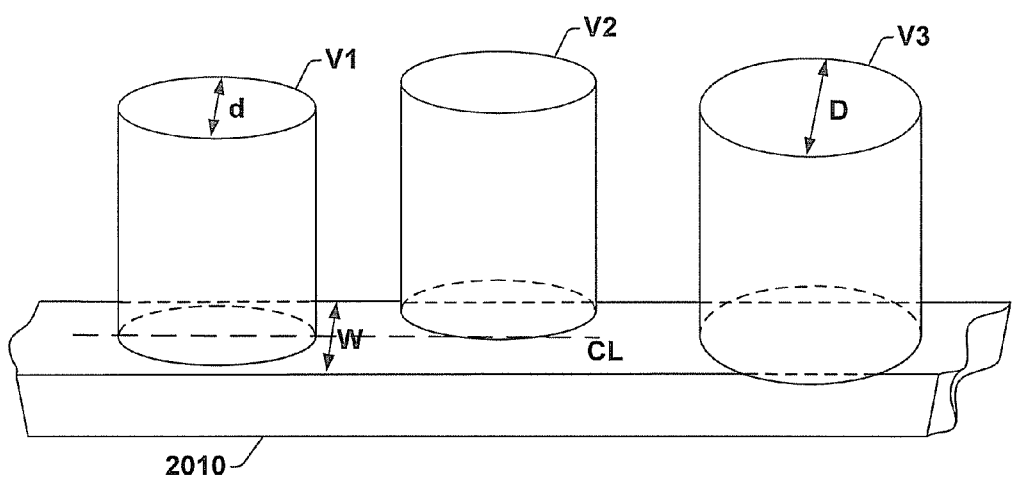
FIG. 20 depicts a plurality of issues regarding via formation in a semiconductor.

By utilizing the grating, the various issues regarding formation of a via (as presented in V2 and V3 of FIG. 20) are addressed, whereby a via can be fabricated having a critical dimension(s) of a size smaller than can be achieved using standard photolithographic (also, known as litho) etching techniques and where the location of the via is precisely controlled with respect to the location of the various conductive elements comprising the multilayer stack. Hence standard photolithographic techniques can be employed to create a via with accurate placement and with a critical dimension not typically achievable by the standard photolithographic technique alone. By utilizing the various exemplary, non-limiting embodiments presented herein it is possible to achieve an interconnect having a dimension and placement as required by interconnect V1 of FIG. 20.

Throughout the description, the term dielectric (e.g., dielectric 110, dielectric 130) is employed to describe a material having insulating properties being utilized to separate other layers, and can include one or more materials considered to be dielectrics, insulators, etc. In effect, to facilitate description of the various embodiments presented herein the term dielectric is employed to indicate a layer having dielectric or insulative properties compared with the conductive properties of a metal line, metallization layer, etc. Hence, while the term dielectric is employed throughout the description, it is to be appreciated that the term dielectric does not limit a layer to be comprised of dielectric material, rather the layer can comprise of an insulator, or other material acting as a separation layer, wherein separation can either be provided spatially or in terms of a material property, such as provides electrical separation between layers.

Dielectrics can include materials such as an insulative oxide layer, silicon dioxide, silicon oxynitride, boronitride, silicon boronitride and silicon carbide. Dielectric layer(s) can also comprise low k inorganic materials and low k polymer materials including polyimides, fluorinated polyimides, polysilsequioxane, benzocyclobutene (BCB), parlene F, parlene N and amorphous polytetrafluoroethylene. A specific example of a commercially available low k polymer material is Flare™ from AlliedSignal believed to be derived from perfluorobiphenyl and aromatic bisphenols. Low k polymer materials provide electrical insulation between various layers, devices and regions within semiconductor substrates.

Further, layers comprising any of organic film (e.g., organic film layers 150 and 170), patterning film, carbon film, or the like, can be utilized to facilitate formation of the self aligned via. Where such films can be of any suitable material, e.g., cyclopentene, pyroline, norbornadiene, etc., and of any suitable thickness as to facilitate formation of the self aligned via.

Further, a dielectric, organic film, etc., may be formed to any suitable thickness using any suitable technique, for instance, using chemical vapor deposition (CVD) techniques. CVD techniques include low pressure chemical vapor deposition (LPCVD) or plasma enhanced chemical vapor deposition (PECVD). In an exemplary, non-limiting embodiment, dielectrics, organic films, etc., presented herein (e.g., dielectrics 110, 130, organic films 150, 170) can be employed as an etch stop layer as part of the patterning of the first hard mask layer, and other dielectrics, organic films, etc., can be used in patterning of the second hard mask layer. A particular etch can be utilized to remove a particular layer of dielectric or organic film (e.g., any of dielectrics 110, 130, organic films 150, 170), while a different etch is required to facilitate patterning of the first hard mask and the second hard mask. By utilizing different etching processes (e.g., different etchants) desired portions of a particular layer can be removed while portions of a disparate layer are left intact. It is to be further appreciated that while only a single layer dielectric or organic film (e.g., dielectrics 110, 130, organic films 150, and 170) is typically shown between layers, (e.g., between the combined dielectric 110/conductor 120 layer and the first hard mask 140), a dielectric or organic film can comprise of a plurality of layers. For example, a single dielectric or single organic film can be replaced with a plurality of layers comprising a dielectric layer, interlayer dielectric (ILD), a low k polymer layer, organic film, patterning film, carbon film, etc.

Any suitable technique can be used to pattern any of the material layers presented herein, (e.g., dielectric, patterning film, organic film, carbon film, hard mask, etc.). For example, patterning can be created by employing a photoresist which is patterned using standard photolithographic techniques to form the required pattern to create the pattern, trenches, openings, etc., wherein the photoresist is exposed to electromagnetic radiation through a mask having an image pattern of a desired layout (e.g., desired trenches, openings, line patterning, etc.). Openings are then formed in the photoresist in order to form the desired layout, e.g., by etching away the exposed material (in the case of a positive photoresist) or etching away the unexposed material (in the case of a negative photoresist). Depending on the material of the photoresist, exposure can create a positive or a negative. With a positive photoresist, exposure causes a chemical change in the photoresist such that the portions of the photoresist layer exposed to light become soluble in a developer. With a negative photoresist, the chemical change induced by exposure renders the exposed portions of the photoresist layer insoluble to the developer. After exposure and develop, a layout according to the desired pattern is laid out on the first layer. A subsequent processing step, such as an etching step or an ion implantation step, can be performed and controlled according to the layout. For instance, after exposure and develop, material in the first layer not covered by the photoresist layer can be etched, thus transferring the pattern to the first layer. The photoresist can be subsequently removed. Etching can be by any viable dry or wet etching technique. For example, a wet or dry etching technique can be employed for patterning, while in another aspect, etching can be by a specific anisotropically etch.

As described herein, the formation of the via opening (e.g., opening 180) can be formed using anisotropic etching techniques where the etching process can be controlled to occur in a specific direction (unlike standard wet etching) such as vertically down into the stack as the via opening is formed between respective layers of dielectric, organic film, and hard masks. An etching technique of particular applicability to the various material processes herein in reactive-ion etching (RIE). In another aspect, plasma ashing can be employed to remove various material layers, photoresists, organic films, etc.

Levelling of layers after formation can be by any suitable technique, e.g., by chemical metal polish (CMP) or other suitable process, in preparation for the next stage in creation of the multilayer stack.

As described, utilization of materials (e.g., particular dielectrics chosen for dielectric layers 110, 130, organic films chosen for organic films 150, 170, first hard mask, second hard mask, etc.) having etch selectivity in combination with patterning of the respective hard masks (e.g., hard mask 140 and hard mask 160) forms a basis of the various innovative aspects presented herein. In an exemplary, non-limiting embodiment, the hard mask layers can comprise of titanium nitride (TiN), or any other suitable hard mask material such as TaN, silicon dioxide, silicon nitride, silicon oxynitride, boronitride, silicon boronitride, silicon carbide, and the like, and formed by any suitable technique such as chemical vapor deposition (CVD) or advanced spin-on methods.

It is to be further appreciated, in view of the technique of using selective etching to remove respective layers, that the various dielectric layers or organic films (e.g., dielectric 110, dielectric 130, organic film 150, organic film 170, etc.) are not limited to being comprised of the same material, but rather, each respective dielectric layer (e.g., dielectric 110, dielectric 130) or organic film (e.g., organic film 150, organic film 170, etc.) can be comprised of a material disparate to another dielectric layer or organic film, whether the dielectric layers, organic films, are adjacent, or not. As mentioned above, the term dielectric and organic film is being employed to convey a layer(s) being comprised of a material which acts as an isolating layer between other layers. Hence, while a dielectric layer (e.g., dielectric 110) is susceptible to removal by a first etchant, an organic film layer (e.g., organic film 170) may be inert, in terms of susceptibility for removal by the first etchant, and a second disparate etchant is required to facilitate removal of the organic film layer.

It is to be appreciated that while the formation and deconstruction of the various layers, elements, etc., comprising the stack are described, there may be certain procedures that are not fully disclosed during description of the various embodiments as presented herein. However, rather than provide description of each and every operation involved in the various operations facilitating formation, patterning, removal, etc., of each layer presented herein, for the sake of description only the general operations are described. Hence, while no mention may be presented regarding a particular operation pertaining to aspects of a particular figure, it is to be appreciated that any necessary operation, while either not fully disclosed, or not mentioned, to facilitate formation/deconstruction of a particular layer/element/aspect presented in a particular figure is considered to have been conducted. For example, while no mention may be made regarding a layer described in a preceding figure being leveled (e.g., by chemical metal polish, or other suitable operation) it is considered, for the sake of readability of the various exemplary embodiments presented herein, that the leveling process occurred, as have any other necessary operations. It is appreciated that the various operations, e.g., leveling, chemical metal polish, patterning, photolithography, spin coating, deposition, etching, RIE etch, etc., are well known procedures and are not necessarily expanded upon throughout this description.

Fabricating an Interconnect with Hard Masking

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the disclosed information when considered in conjunction with the drawings.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices may be shown in block diagram form in order to facilitate describing the claimed subject matter.

FIGS. 1 to 16 illustrate a plurality of stages in the formation of a self aligned via, in accord with various embodiments as presented herein. FIGS. 1-16 depict formation and partial deconstruction of a multilayer stack having a plurality of layers comprising dielectric(s), conductor(s), metal line(s), metallization layer(s), substrate(s), via opening(s), ILDs, insulator(s), patterning film, organic film, carbon film, etc., as required to form an integrated circuit.

A common illustrative format is employed to depict the respective stages in formation/deconstruction of the multilayer stack illustrated in FIGS. 1-16. In each figure, the top left depiction is a top down view of the multilayer stack as it is being constructed (e.g., FIGS. 1-8) and deconstructed (e.g., FIGS. 9-16). In each of FIGS. 1-16 the lower section is a respective section taken along X-X of the multilayer stack top down view, and the section on the right of each FIG. 1-16 is a respective section taken along Y-Y of the multilayer stack top down view. As illustrated in FIGS. 1-16, while a particular layer or structure is visible in view X-X, the particular layer or structure may not be visible in view Y-Y (and vice-versa). For example, in FIG. 8, elements of the patterned first hard mask 140 are only visible in view Y-Y, while elements of the patterned second hard mask 160 are only visible in view X-X. Hence, as shown in FIG. 8, the respective elements of the patterned first hard mask 140 are aligned orthogonally opposed to the elements of the patterned second hard mask 160, such orthogonally opposed alignment of patterned hard masks in the formation of a self-aligned via having desired critical dimension(s) will be explained herein.

Figure 1:
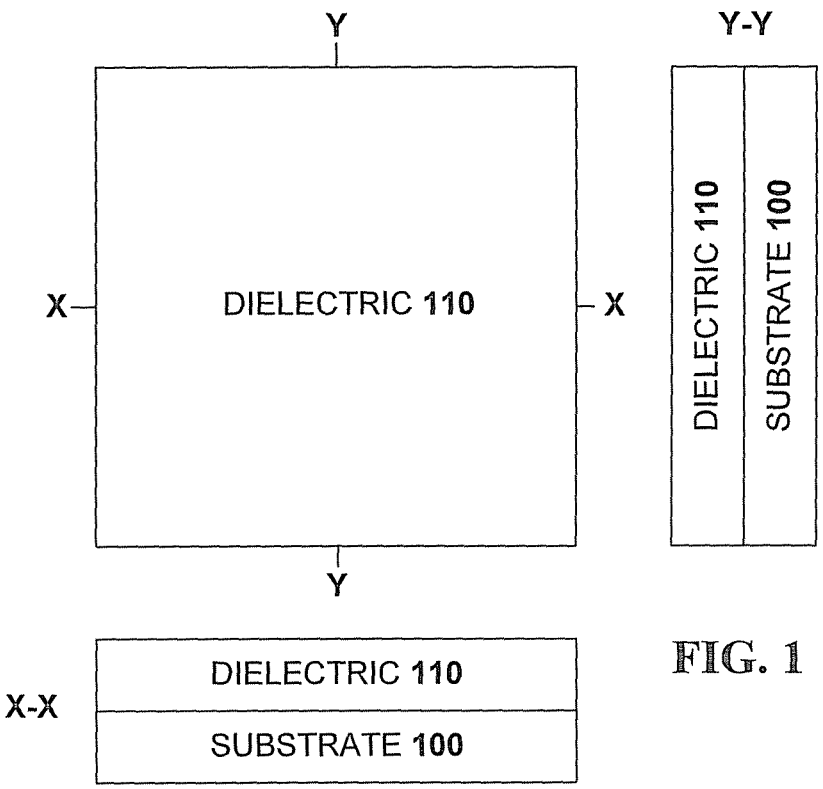
FIG. 1 is a block diagram of an exemplary semiconductor stack according to an embodiment of the subject innovation.

FIG. 1, illustrates the initial stage in formation of the multilayer stack, with depiction of a substrate 100 having a dielectric 110 layer formed thereon. Substrate 100 may include any suitable semiconductor material, for example, a monocrystalline silicon substrate. It is to be appreciated that substrate 100 may also comprise of a pre-existing semiconductor apparatus or multilayer stack, for example, substrate 100 may be a semiconductor device comprising a multilayer substrate comprising a plurality of layers including monocrystalline silicon, dielectric(s), insulator(s), conductor(s), interlayer dielectric(s) (ILDs), low k polymer layer, patterning film, organic film, carbon film, etc., onto which is further formed a plurality of layers as required to facilitate formation of the self aligned via, as presented herein.

Figure 2:
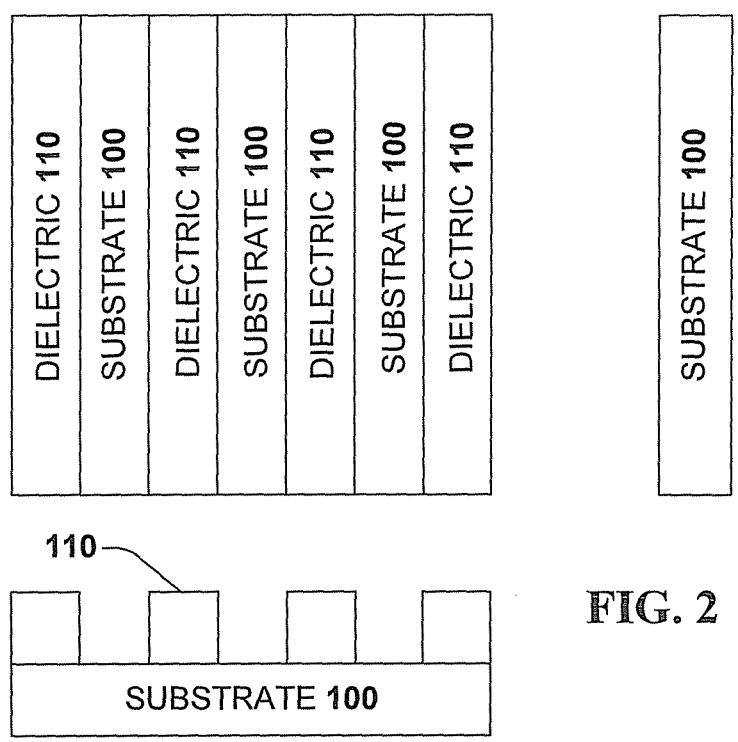
FIG. 2 is a block diagram of an exemplary semiconductor stack according to an embodiment of the subject innovation.

FIG. 2 depicts dielectric 110 patterned to form trenches, openings, line patterning, etc., as required, in dielectric 110. Patterning can be achieved by any suitable manufacturing technique, as described above. Dielectric 110 is subsequently etched with respective portions of patterned dielectric removed with corresponding portions of substrate 100 revealed.

Figure 3:
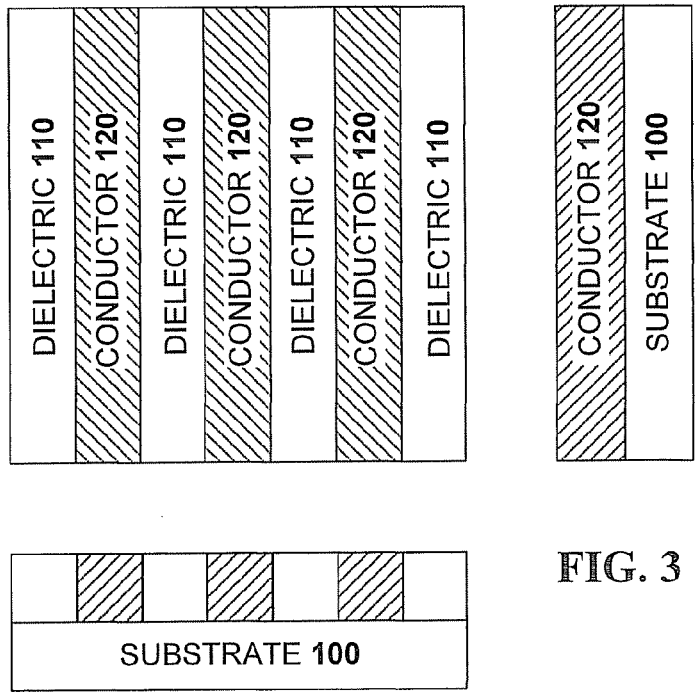
FIG. 3 is a block diagram of an exemplary semiconductor stack according to an embodiment of the subject innovation.

In FIG. 3, construction of the multilayer stack continues with a damascene process being utilized to deposit conductive material, conductor 120, in the trenches, openings, etc., formed in the patterned dielectric 110, thereby forming a structural layer comprising conductive pathways, metal lines, etc., (e.g., conductor 120) separated by insulator material (e.g., dielectric 110). In an exemplary, non-limiting embodiment, conductive material (e.g., conductor 120) is deposited into the trenches, openings, etc., with excess conductive material, and if necessary, dielectric 110 being removed, e.g., by chemical metal polish (CMP) or other suitable process, in preparation for the next stage in creation of the multilayer stack.

Figure 4:
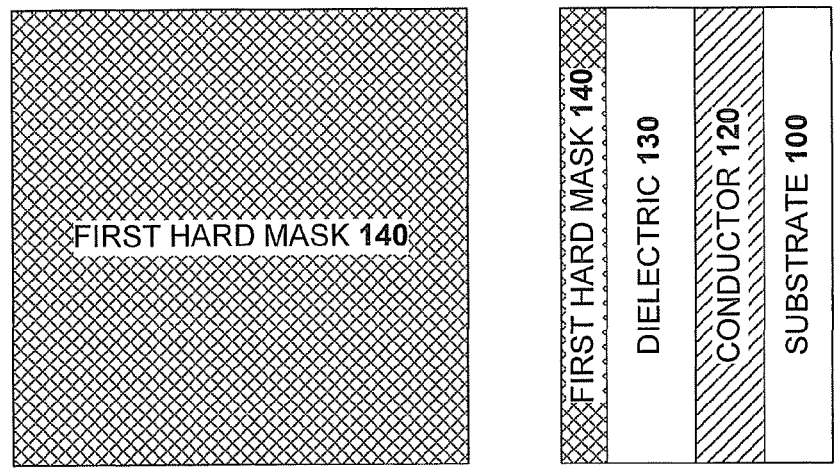
FIG. 4 is a block diagram of an exemplary semiconductor stack according to an embodiment of the subject innovation.
Figure 4:
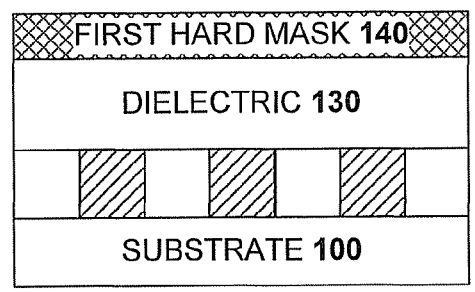

With regard to FIG. 4, a dielectric 130 layer is formed over the combined layer of conductor 120 and dielectric 110. Further, a first hard mask 140 is formed over dielectric 130. In an exemplary, non-limiting embodiment, the first hard mask 140 may comprise of a layer of titanium nitride (TiN) and formed by deposition over dielectric 130 using suitable techniques such as CVD techniques. As described, selection of the material to be employed as a hard mask can be a function of the etchant selectivity of the material. In an exemplary, non-limiting embodiment, by employing such selective etch techniques, one material (e.g., a dielectric) can be removed as part of fabricating an interconnect opening while portions of a second material (e.g., first hard mask 140 and second hard mask 160 are left intact). Hence, by leaving the respective portions of the hard masks intact, the grating formed by the interaction of the first hard mask 140 and second hard mask 160 can be utilized to control removal of dielectric thereby forming an opening (to be subsequently filled during a dual damascene process to form the interconnect) having a desired size (e.g., meets critical dimension requirements) and location with respect to the metal line which the interconnect will be fabricated to connect with. In an exemplary, non-limiting embodiment, it is the utilization of materials having etch selectivity in combination with patterning of a first hard mask 140 and patterning of a second hard mask 160 that form a basis of the various innovative aspects presented herein.

It is to be appreciated that first hard mask 140 may be comprised of any material having etch selectivity with regard to material(s) comprising the various dielectric layers, organic films, etc. (e.g., dielectric 110, dielectric 130, organic film 150, organic film 170, etc.), as described above.

Figure 5:
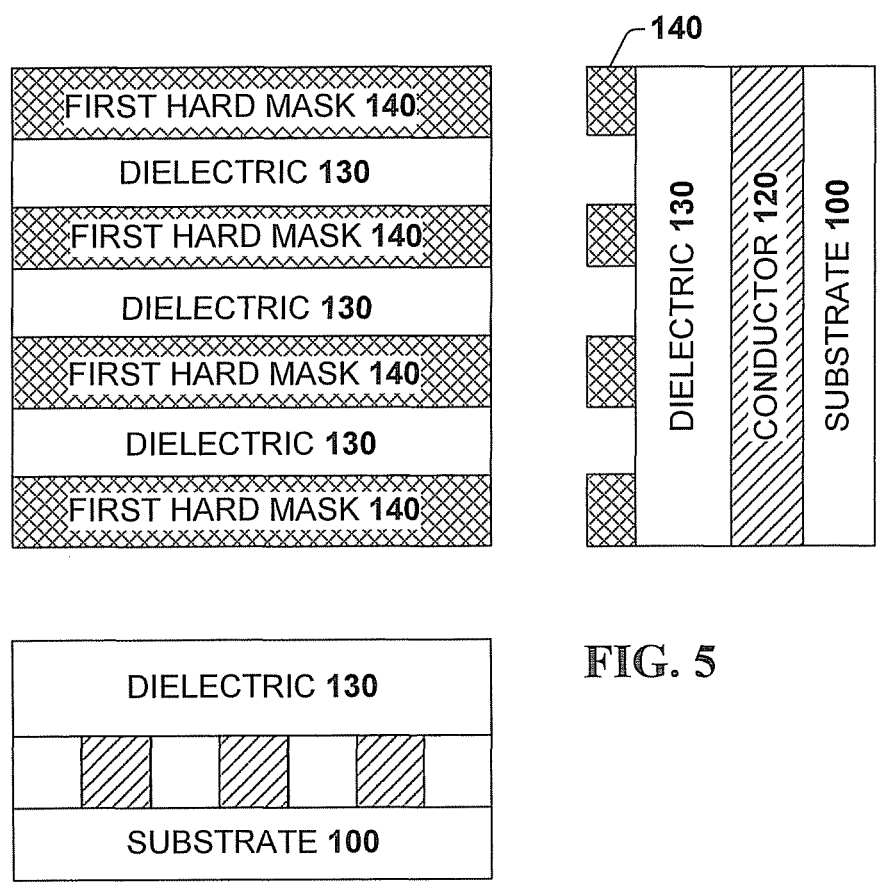
FIG. 5 is a block diagram of an exemplary semiconductor stack according to an embodiment of the subject innovation.

FIG. 5 illustrates the first hard mask 140 having been patterned. Any suitable patterning techniques can be utilized, for example conventional photolithographic techniques in combination with a photoresist and material removal by etching. As shown in FIG. 5, the etching process, and in particular the etchant, utilized to pattern the first hard mask 140, only removes the desired portions of the first hard mask 140, with the dielectric 130 remaining intact. Hence, owing to the application of materials having different etching susceptibilities, as previously described, material comprising one layer can be selectively removed while a disparate second layer remains intact. As shown in FIG. 5, the etchant removed portions of the first hard mask 140 while dielectric 130 remains intact, accordingly, dielectric 130 in the presence of the etchant acts as an etch stop layer for first hard mask 140.

Figure 6:
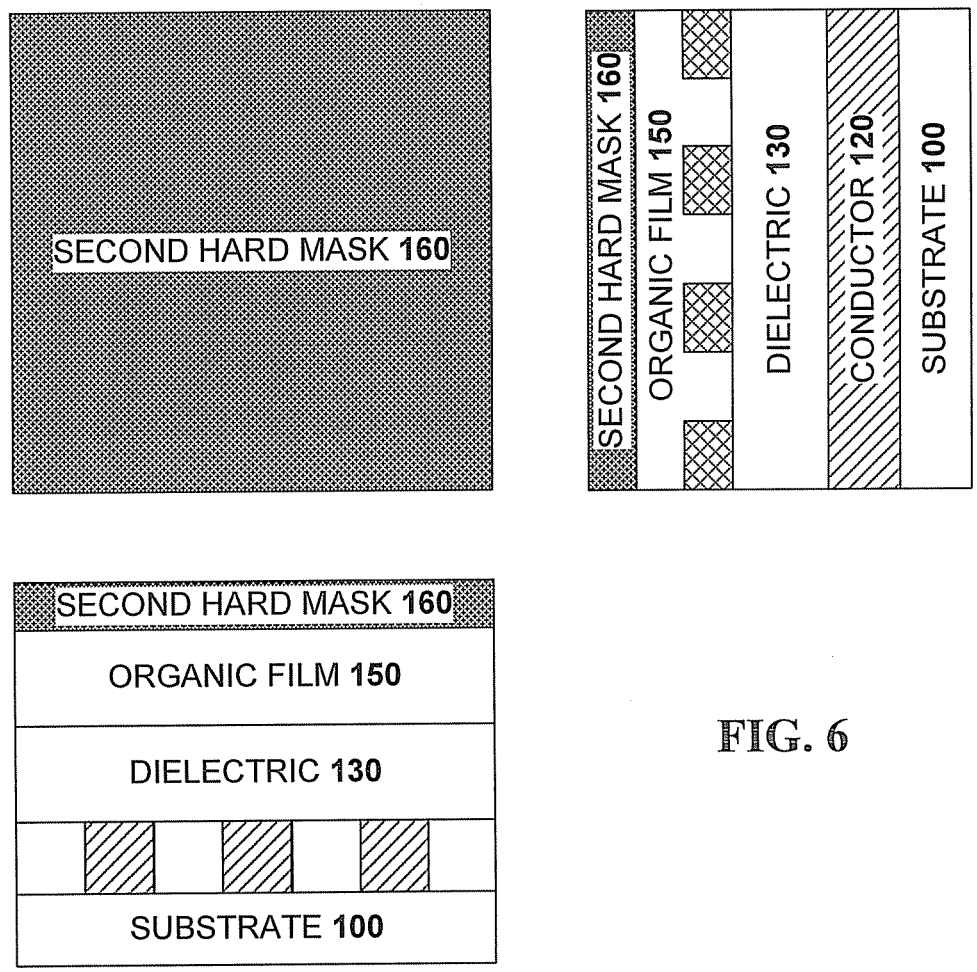
FIG. 6 is a block diagram of an exemplary semiconductor stack according to an embodiment of the subject innovation.

In FIG. 6, an organic film 150 is formed over the patterned first hard mask 140. Whereupon, after the desired formation of the organic film 150 (e.g., planarization of organic film 150) a second hard mask 160 is deposited on organic film 150. Second hard mask 160 can be deposited using suitable techniques such as CVD techniques and can be comprised of any of the materials available to form first hard mask 140. In an exemplary, non-limiting embodiment, second hard mask 160 can comprise the same material as comprising first hard mask 140, wherein both second hard mask 160 and first hard mask 140 comprise TiN. However, it is to be appreciated that disparate materials can be utilized to respectively form second hard mask 160 and first hard mask 140, wherein selection of the disparate materials is based in part on the etching selectivity of the materials with regard to the various operations depicted in FIGS. 1-16 and the materials comprising other layers forming the multilayer stack which are formed/removed in accord with the various embodiments presented herein.

Figure 7:
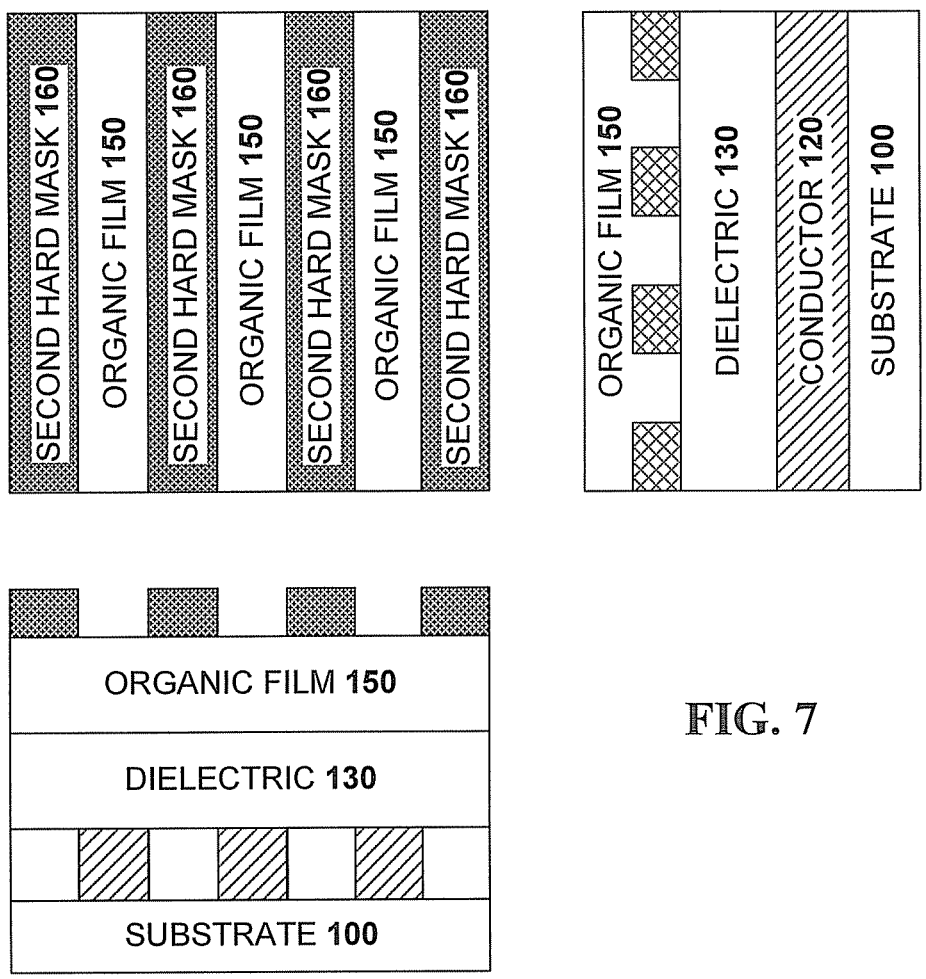
FIG. 7 is a block diagram of an exemplary semiconductor stack according to an embodiment of the subject innovation.
Figure 8:
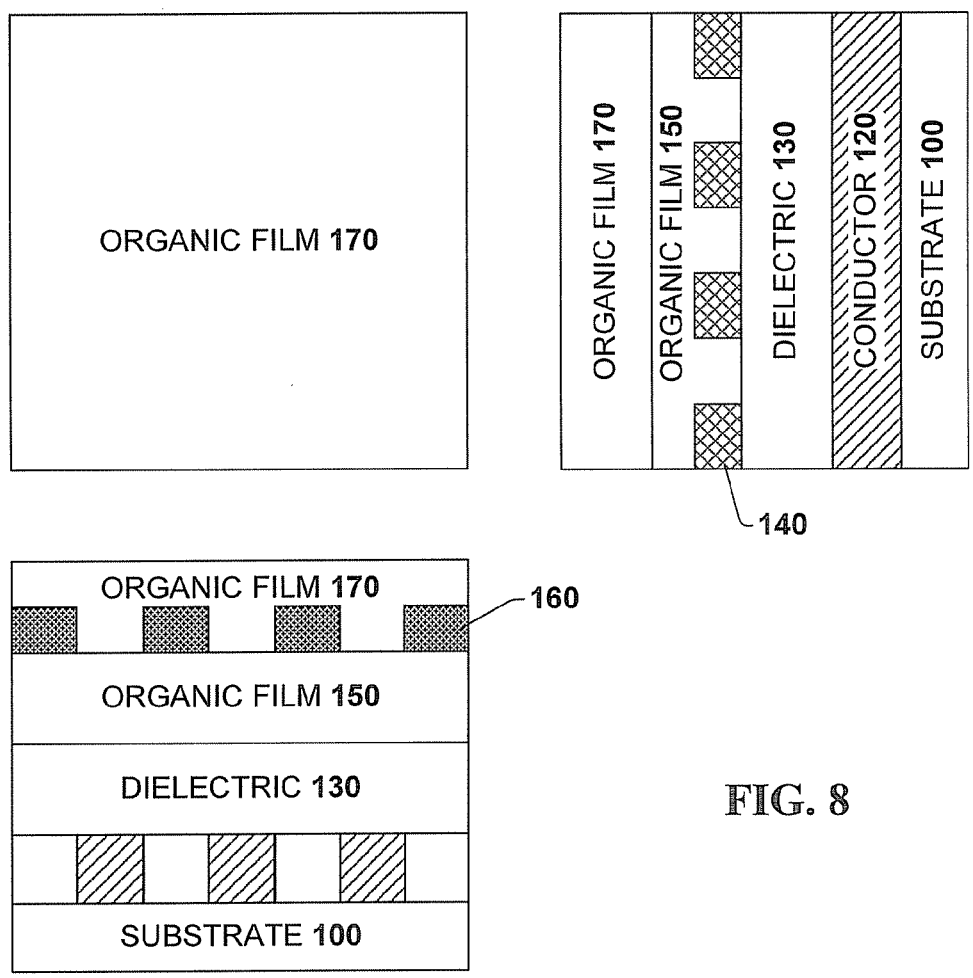
FIG. 8 is a block diagram of an exemplary semiconductor stack according to an embodiment of the subject innovation.
Figure 17:
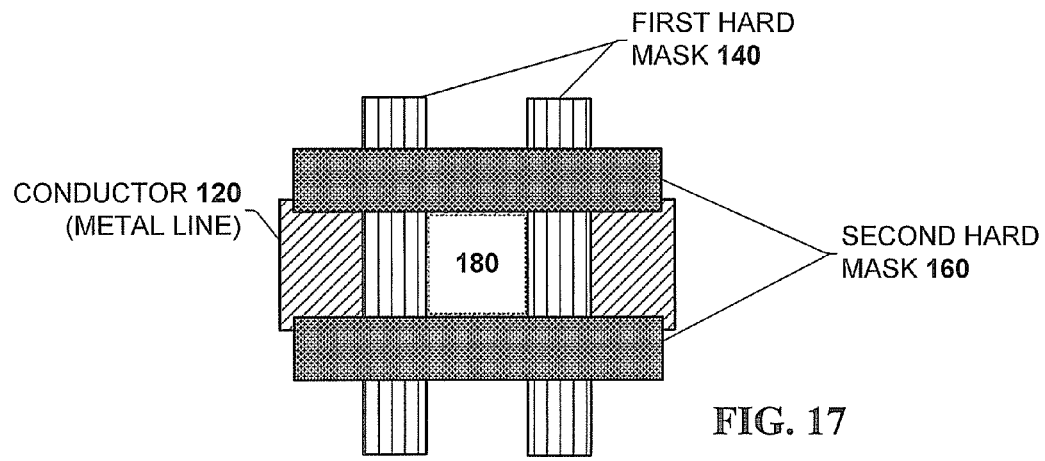
FIG. 17 illustrates interaction of a plurality of hard masks to form a grating effect according to an embodiment of the subject innovation.
Figure 18:
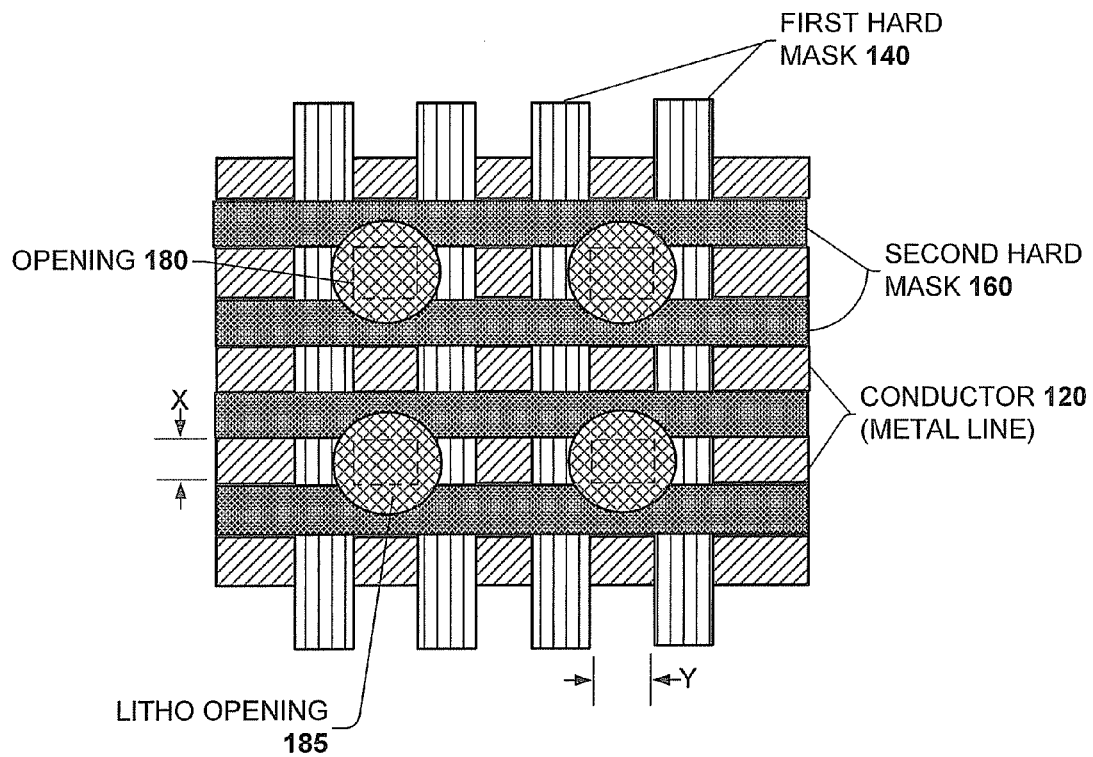
FIG. 18 illustrates interaction of a plurality of hard masks to form a grating effect smaller than a litho via opening according to an embodiment of the subject innovation.
Figure 19:
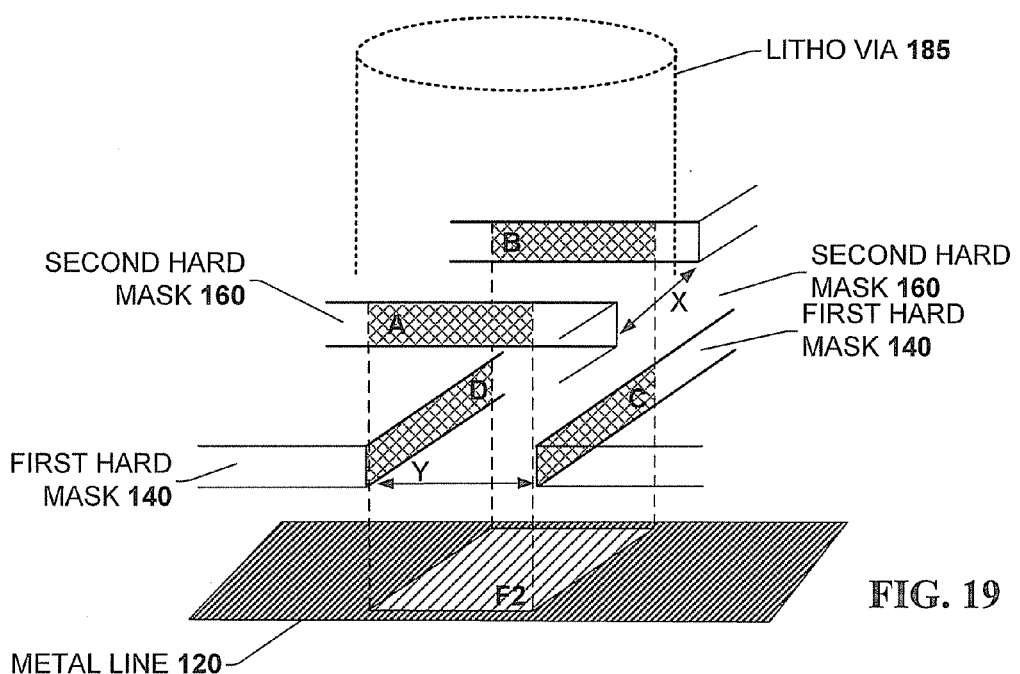
FIG. 19 is a representation of interaction of a plurality of hard masks to form a grating effect smaller than a litho via opening according to an embodiment of the subject innovation.

Turning to FIG. 7, the second hard mask 160 is patterned, where any suitable patterning techniques can be utilized, for example conventional photolithographic techniques in combination with a photoresist and material removal by etching. Patterning of second hard mask 160 is configured to be aligned orthogonally in opposition with the patterning applied to the first hard mask 140 such that a grating effect is produced, as shown in FIGS. 17-19. Turning to FIG. 17 illustrates a pair of first hard mask 140 elements and a pair of second hard mask 160 elements positioned to effectively form a grating which act as boundaries, or guides, to a series of anisotropic etch processes which remove dielectric, organic film, etc., to form the via opening 180, as described herein. As depicted, via opening 180, owing to the grating effect produced by the pair of first hard mask 140 elements and the pair of second hard mask 160 elements, has a size narrower than conductor 120 and is correctly aligned with regard to conductor 120.

FIG. 18 illustrates a plurality of via openings 180 being formed over a plurality of first hard mask 140 elements and second hard mask 160 elements positioned to effectively form a plurality of gratings which respectively act as boundaries, or guides, to a series of anisotropic etch processes which remove dielectric, organic film, etc., to form the respective via openings 180, as described herein. As depicted, by forming a grating, a large lithographic opening 185 (wherein the lithographic opening 185 is greater than the desired critical dimension and can be misaligned) can be reduced down to via opening 180, as described herein.

It is to be appreciated that while presented throughout the description the patterned metal and second hard mask are commonly aligned (e.g., both conductor 120 and second hard mask 160 are horizontally aligned in FIG. 18) with the first hard mask being aligned orthogonally opposed therewith (e.g., first hard mask 140 is vertically aligned in FIG. 18), the various exemplary embodiments presented herein are not so limited, and it is to be appreciated that the patterned metal and first hard mask patterning can be commonly aligned, with the second hard mask aligned orthogonally opposed therewith.

Turning to FIG. 8, an organic film 170 is formed over the patterned second hard mask 160. To further understanding of the various embodiments presented herein, it is to be noted that, as shown in FIG. 8, elements of the patterned first hard mask 140 are only visible in view Y-Y, while elements of the patterned second hard mask 160 are only visible in view X-X. Hence, as shown in FIGS. 8, 17, 18, and 19, the respective elements of the patterned first hard mask 140 are aligned orthogonally opposed to the elements of the patterned second hard mask 160. Such orthogonally opposed alignment of patterned hard masks in the formation of a self-aligned via will be explained further herein. Effectively, with regard to the various exemplary, non-limiting embodiments presented herein, at this stage the stack is fully constructed and further description, FIGS. 9-16, describe deconstruction of the stack and formation of the via opening.

Figure 9:
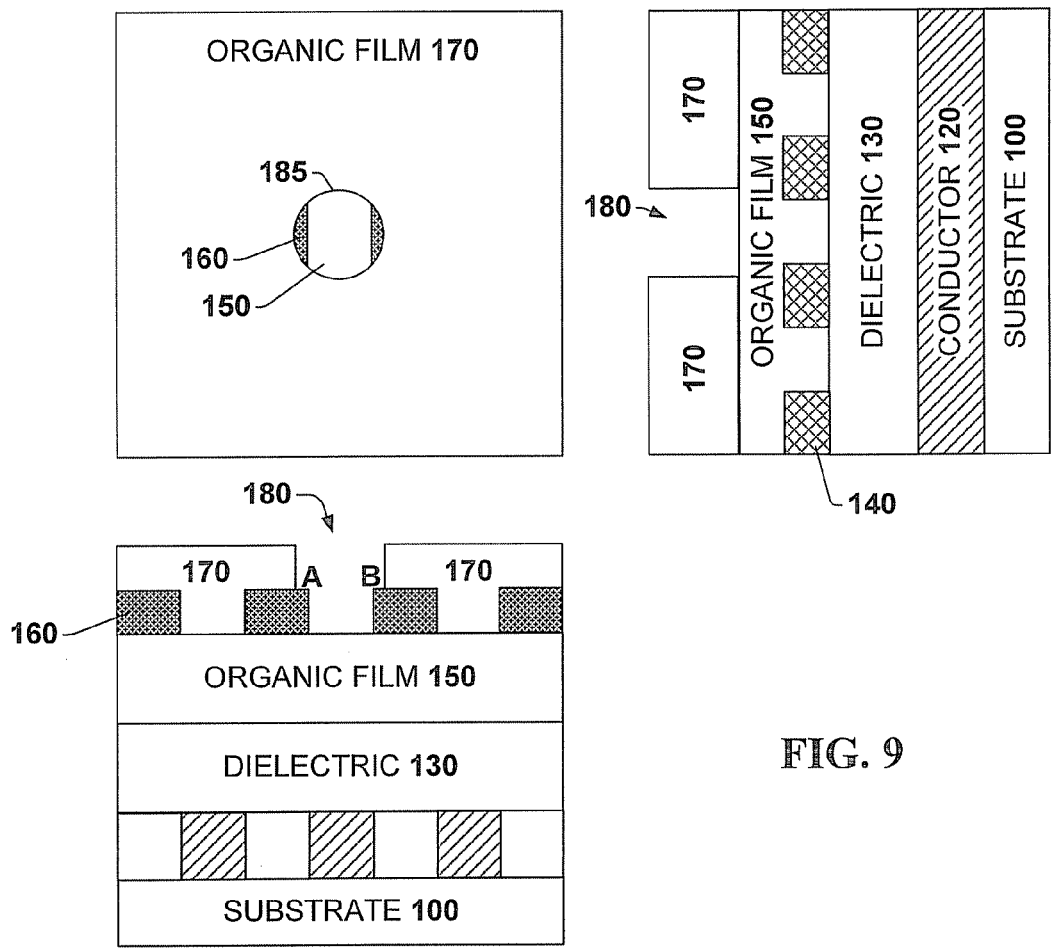
FIG. 9 is a block diagram of an exemplary semiconductor stack according to an embodiment of the subject innovation.

FIG. 9 illustrates the initial formation of opening 180 where a respective amount of organic film 170 is removed to form an opening 180 in organic film 170. As shown, the diameter of litho opening 185 of opening 180 is such that a portion of the edges of the pair of patterned second hard mask 160 elements (respectively denoted A and B in FIG. 9, X-X) are exposed. Effectively, in the X-X section an opening 180 is formed having a T-shaped profile (as shown in FIG. 9, X-X) while in the Y-Y section the opening 180 is of a constant profile or section (e.g., a constant diameter equivalent to litho opening diameter 185) throughout the depth of opening 180 (as shown in FIG. 9, Y-Y). Organic film 170 can be removed by reactive-ion etch (RIE) which can be configured to selectively etch the organic film 170 while exposing, but not removing, the edges A and B of the patterned second hard mask 180. It is to be noted that dielectric 150 acts as an etch stop for the removal of organic film 170. Hence in the exemplary, non-limiting embodiment presented in FIG. 9, materials selected to respectively comprise second hard mask 160, organic film 170, and organic film 150, have been selected based upon selective etching. As mentioned previously, second hard mask 160 can comprise TiN, while to facilitate selective etching of organic film 170 but leaving organic film 150 intact, organic film 170 and organic film 150 are of disparate materials wherein the material selected for organic film 150 is not susceptible for etching utilized to remove the material comprising organic film 170.

Figure 10:
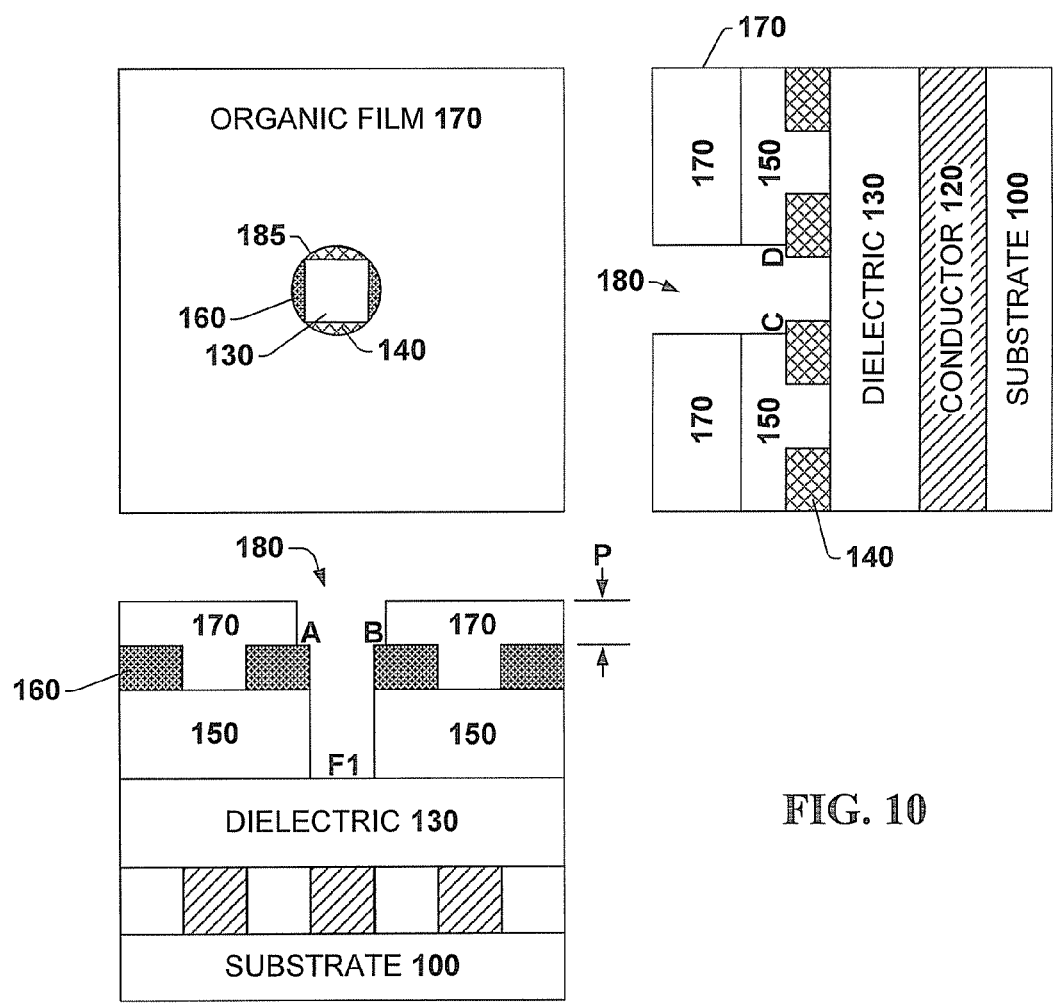
FIG. 10 is a block diagram of an exemplary semiconductor stack according to an embodiment of the subject innovation.

Turning to FIG. 10, opening 180 is extended as a result of removal of material from organic film 150, wherein organic film 150 may be removed by selective anisotropic etching in relation to the etchant employed to remove organic film 170. As shown in FIG. 10, top view, litho opening 185, while originally having a circular cross-section, as a result of the exposed walls of the patterned second hard mask 160 (respectively denoted A and B in FIG. 10, X-X) and the exposed walls of the patterned first hard mask 140 (respectively denoted C and D in FIG. 10, Y-Y), the footprint F1 (see FIG. 10, X-X) of the opening 180 on the dielectric 130 is effectively of a square cross-section. It is to be appreciated that the shape of the footprint of opening 180 is a function of the respective positioning of the exposed walls of patterned second hard mask 160 and the exposed walls of patterned first hard mask 140, and accordingly any footprint cross-section can be formed of any controlled shape, e.g., a square, rectangle, trapezoidal, diamond, curved edge, and the like.

It is to be further appreciated that owing to the etching process, e.g., anisotropic etching to remove respective material from organic film 170 and organic film 150, the formation of opening 180 is effectively self aligning based upon the respective positioning of the exposed walls A and B of patterned second hard mask 160 and the exposed walls C and D of patterned first hard mask 140. Owing to the selective etching process, dielectric 130 acts as an etch stop for the removal of organic film 150.

Figure 11:
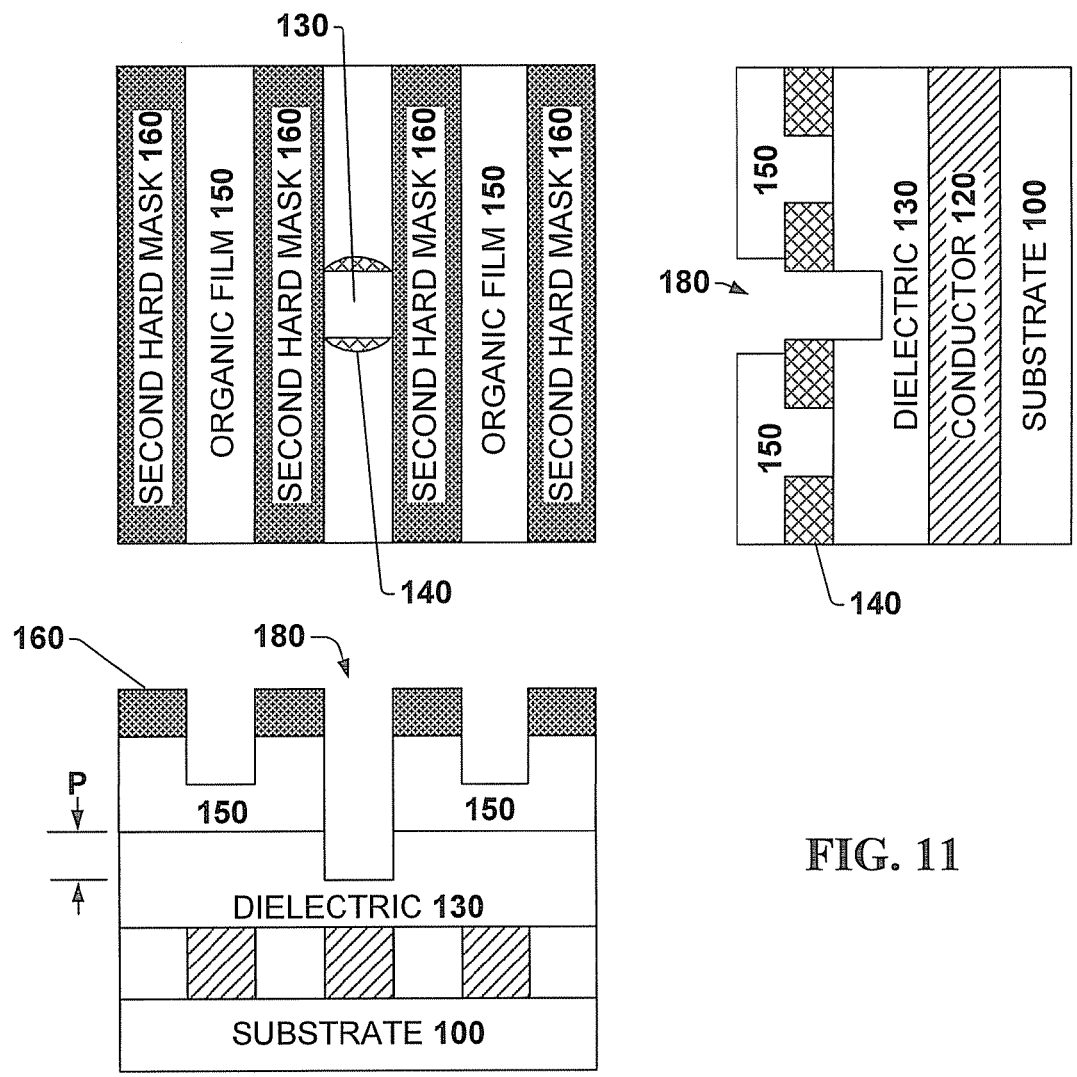
FIG. 11 is a block diagram of an exemplary semiconductor stack according to an embodiment of the subject innovation.

As shown in FIG. 11, the multilayer stack is further deconstructed with organic film 170 being removed. In one embodiment, organic film 170 and dielectric 130 can be removed with a common etchant, and hence the depth of opening 180 is increased by distance P (see FIG. 11, X-X) in dielectric 130, which corresponds to the height of organic film 170 which is removed from the original amount denoted distance P in FIG. 10, X-X. In removing organic film 170, the patterned second hard mask 160 is exposed, as shown in FIG. 11, top view. As illustrated in FIG. 11, X-X, opening 180 has a width corresponding to the distance between the respective elements of the patterned second hard mask 160, while as shown in FIG. 11, Y-Y, opening 180 has a T-shaped profile owing to the limitation of material removal (e.g., etching) provided by the respective elements of the patterned first hard mask 140.

Figure 12:
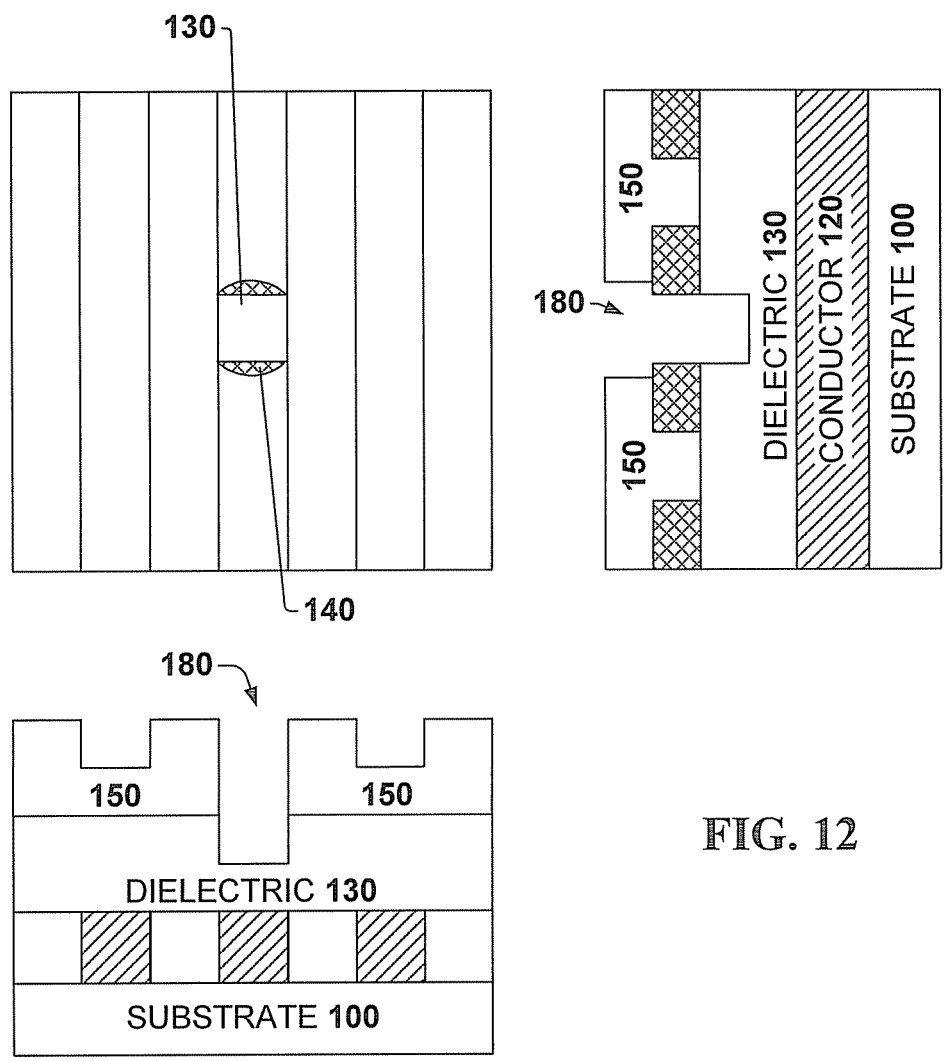
FIG. 12 is a block diagram of an exemplary semiconductor stack according to an embodiment of the subject innovation.
Figure 13:
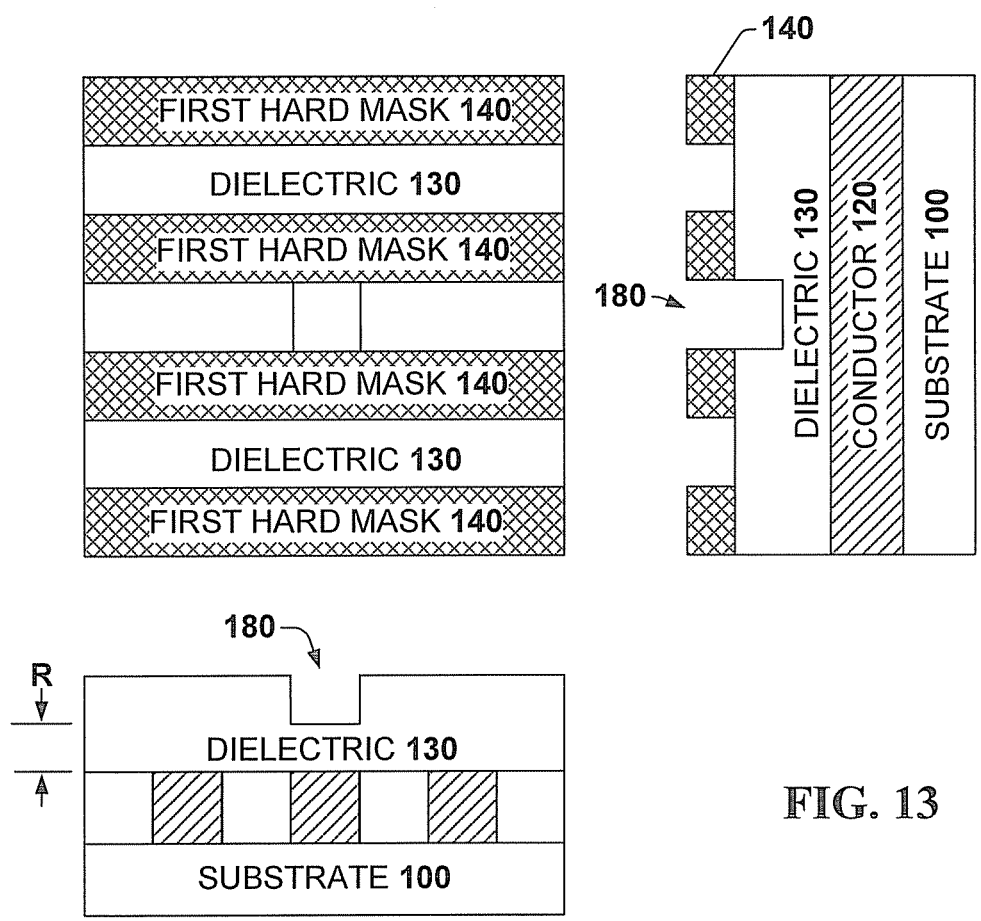
FIG. 13 is a block diagram of an exemplary semiconductor stack according to an embodiment of the subject innovation.

In FIG. 12, deconstruction of the multilayer stack continues with removal of the patterned second hard mask 160. As previously described, an etching process (e.g., a particular etchant) can be utilized to selectively remove the second hard mask 160 while leaving organic film 150, dielectric 130 and first hard mask 140 in their current state Turning to FIG. 13, organic film 150 is removed resulting in exposure of the patterned first hard mask 140 and dielectric 130. As shown in FIG. 13, top view, and FIG. 13, X-X, opening 180 retains edges resulting from the etching constraint effected by the patterned second hard mask 160.

Figure 14:
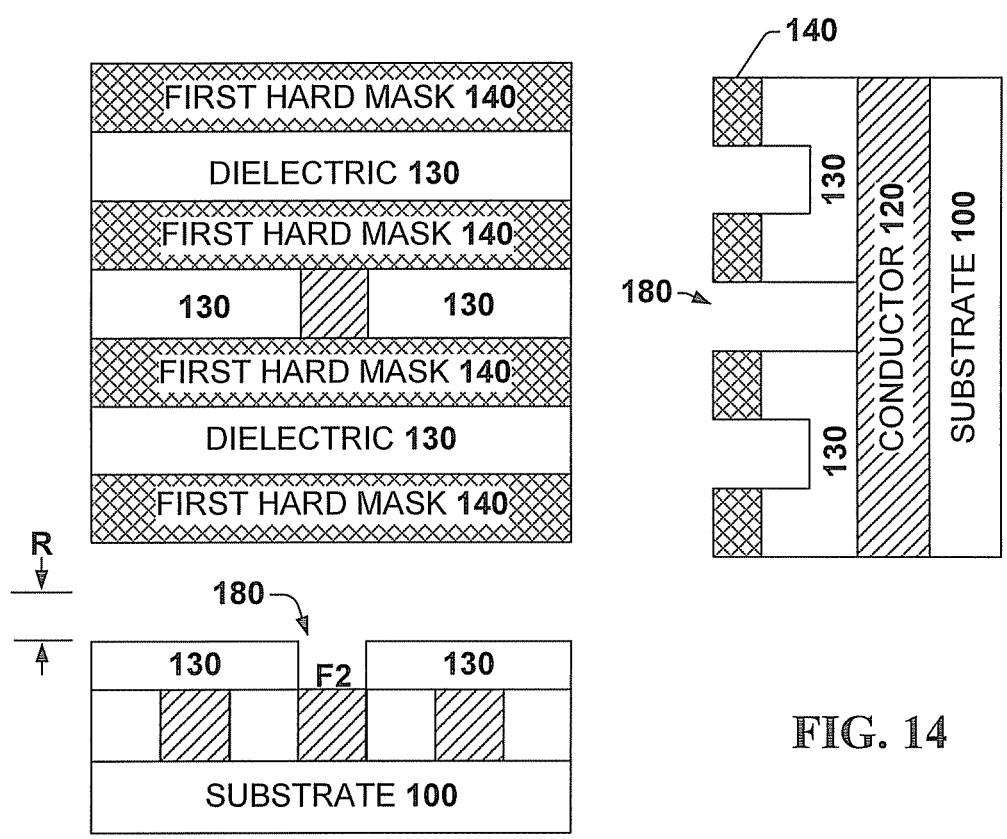
FIG. 14 is a block diagram of an exemplary semiconductor stack according to an embodiment of the subject innovation.

In FIG. 14, deconstruction of the multilayer stack continues with a portion of dielectric 130 being removed to expose conductor 120 at footprint F2 of opening 180. In one embodiment, a thickness of R material of dielectric 130 is removed, corresponding to the amount of material R between the bottom of opening 180 from the previous material removal (see FIG. 13, X-X) and the exposed conductor 120 in footprint F2 of FIG. 14, X-X.

Figure 15:
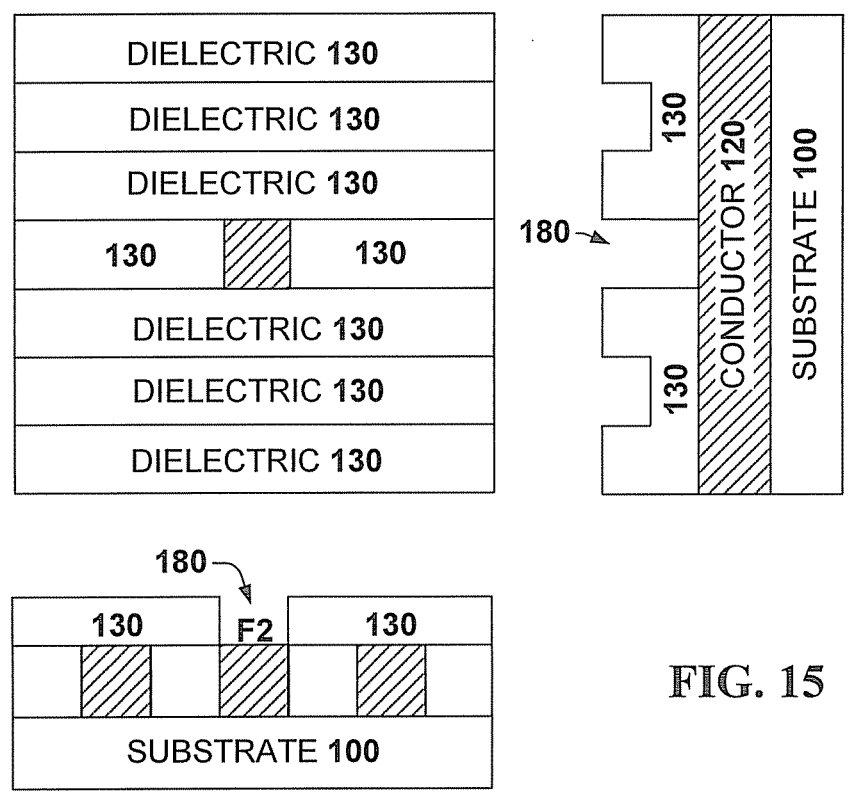
FIG. 15 is a block diagram of an exemplary semiconductor stack according to an embodiment of the subject innovation.

Referring to FIG. 15, a selective etch is performed to facilitate removal of the patterned first hard mask 140. As shown in FIG. 15, a patterned surface of dielectric 130 remains along with exposed conductor 120 at footprint F2 of opening 180.

Figure 16:
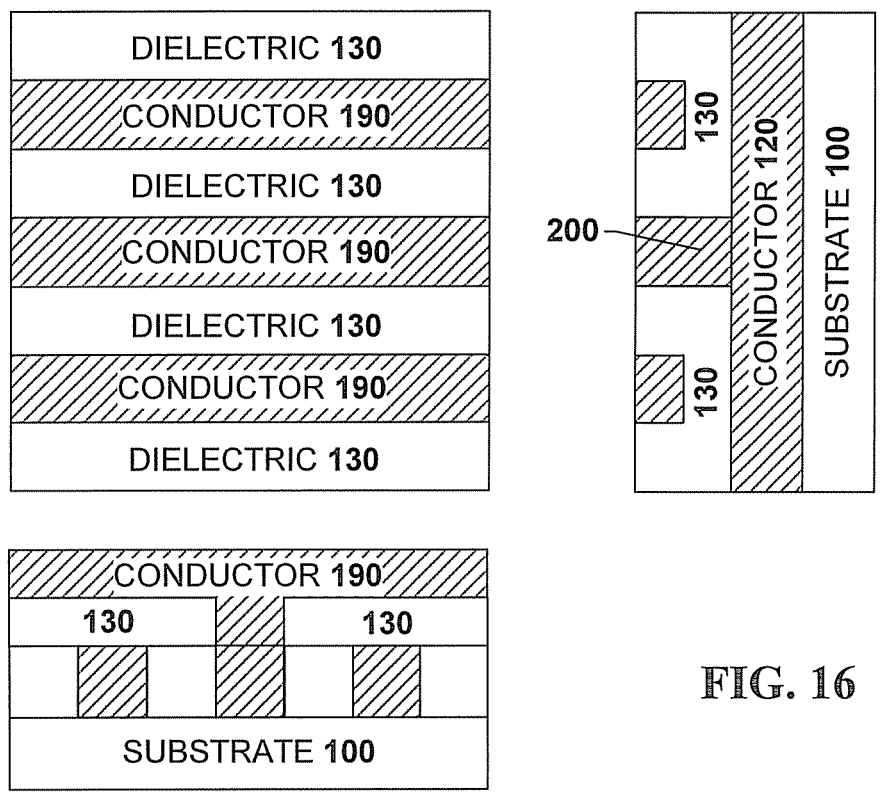
FIG. 16 is a block diagram of an exemplary semiconductor stack according to an embodiment of the subject innovation.

In FIG. 16, a dual damascene process is performed with the patterned dielectric 130 being filled with conductor 190 to form respective metal line(s) and via 200 in the patterned dielectric 130, where via 200 provides connection between a respective metal line in patterned dielectric 130 with a respective line (e.g., conductor 120) in patterned dielectric 110.

As shown in FIGS. 1-16 illustrating construction of a stack and deconstruction of a stack, along with FIGS. 17 and 18, depicting the interaction of a first hard mask 140 and a second hard mask 160, the final dimension of via 200 is not determined by the initial opening (see litho opening 185 in FIG. 9, top view, X-X, or Y-Y, and litho opening 185 in FIG. 18) formed by the initial lithographic operation but, rather, the final dimension of via 200 is a function of the width between respective elements in a first hard mask, the width between respective elements in a second hard mask, and their interaction where the edges of the second hard mask are aligned orthogonally (e.g., at 90°) opposed to the edges of the first hard mask.

To facilitate further understanding of the various exemplary, non-limiting embodiments presented herein, FIG. 19 is presented to provide a three-dimensional representation of particular elements affecting formation of a self-aligning via opening having desired critical dimensions. For ease of understanding, the various elements comprising FIG. 19 have been labeled with numbering carried over from the respective elements illustrated in the pertinent figures comprising FIGS. 1-18, and accordingly, FIG. 19 is to be viewed accompanied by the respective FIGS. 1-18. It is to be appreciated, to aid illustration, none of the dielectric layers 110, 130, or organic films 150, 170, are shown in FIG. 19, however respective first hard mask 140 and second hard mask 160 as positioned vertically as if separated by the respective dielectric layers 110, 130, or organic films 150, 170.

FIG. 19 illustrates an overly large (e.g., larger than a desired critical dimension(s)) lithographic via 185 being reduced down to an opening with a footprint F2, wherein footprint F2 is correctly aligned with regard to conductor 120 (e.g., a metal line) and having the desired critical dimension(s), e.g., footprint F2 is sized to reside wholly within the surface of conductor 120.

As shown, the pair of edges A and B of the patterned second hard mask 160 act to constrain the size of the opening in direction X. Further, the pair of edges C and D of the patterned first hard mask 140 act to further constrain the size of the opening in the Y direction. Accordingly, the combined effects of constraining in the X direction and the Y direction, act to reduce the dimensions of an original lithographic opening 185 to the dimensions of footprint F2. Hence, while an original opening may not be correctly aligned, or of excessive dimension, (e.g., the opening available from conventional lithographic techniques depicted by lithographic via 185) by combining a patterned first hard mask with a patterned second hard mask, an opening, and an interconnect/via subsequently produced (e.g., by a damascening process) from the opening can be correctly aligned and having critical dimensions.

Figure 21:
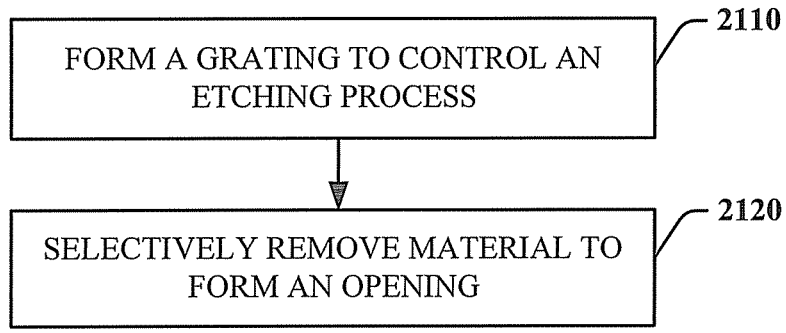
FIG. 21 illustrates a flow for forming a grating to control removal of material in accordance with one or more embodiments of the subject innovation.

FIG. 21 presents a flow diagram illustrating an exemplary, non-limiting embodiment for forming an interconnect in an integrated circuit structure. As described above, semiconductor devices and device features are pushing the limits regarding what can be achieved with conventional photolithographic technologies in forming openings in multilayer semiconductor stacks, where the openings are subsequently filled (damascened) to form interconnects, vias, etc. Conventional photolithographic techniques are limited in their ability to produce openings having a critical dimension and accurately located with regard to the conductor to be joined by the interconnect, via, etc. Accordingly, rather than attempting to control the formation of the opening based upon the operating limits of the photolithographic technology, other approaches are required to ensure the photolithographic methods are controlled to produce the desired openings, etc., having required critical dimensions and correct location.

At 2110, a grating is formed to control an etching process. With conventional photolithographic techniques the minimal size (e.g., diameter of opening) with which an opening can be formed by etching is often greater than the required diameter (e.g., critical dimension) of the opening to be formed, and the size of the interconnect, via, etc., formed from the opening (e.g., as part of a damascening operation). By employing a grating the effective surface area (e.g., bottom of opening 180, footprints F1 and F2 respectively) being affected by the etching process can be constrained. For example, in an exemplary, non-limiting embodiment, materials can be selected to form the grating (e.g., first hard mask 140 and second hard mask 160) which are not affected (e.g., removed) by an etching process utilized to remove material (e.g., dielectrics 110, 130, or organic films 150, 170) to form the opening (e.g., opening 180).

At 2120, depending upon the materials selected to form the grating (e.g., first hard mask 140 and second hard mask 160) and the various other layers comprising the multilayer stack (e.g., dielectrics 110, 130, or organic films 150, 170) series of etching processes can be performed to selectively remove material in the formation of the opening. As discussed above, a plurality of layers are constructed and deconstructed during the formation of the interconnect, in accord with the various exemplary, non-limiting embodiments presented herein, where the plurality of layers can comprise of dielectric, insulator, ILD, mask, photoresist, organic film, patterning film, carbon film, etc. By utilizing a grating in combination with selective etching of materials/layers, the etching process(es) can be constrained such that material is removed to facilitate formation of an interconnect having critical dimension and being self-aligning (e.g., correctly located).

Figure 22:
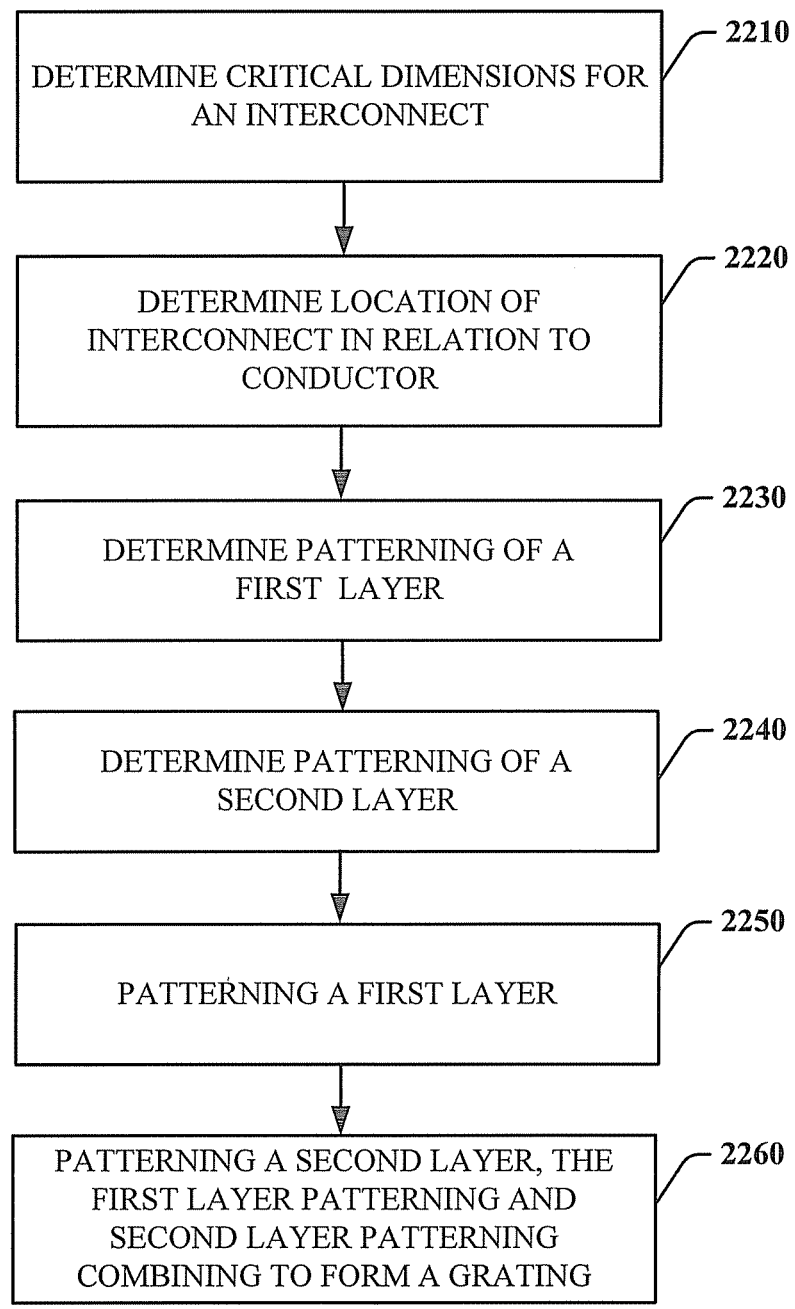
FIG. 22 illustrates a flow for generating patterning of layers in accordance with one or more embodiments of the subject innovation.

FIG. 22 presents a flow diagram illustrating an exemplary, non-limiting embodiment for forming an interconnect in an integrated circuit structure. At 2210, the critical dimensions for an interconnect are determined. As described above, dimensions of interconnects has become critical to ensure correct placement of the interconnect in relation to the conductor being joined therewith, and also to maximize the amount of material (e.g., dielectric, insulator, etc.) between proximate interconnects to minimize unwanted effects of current leakage, parasitic capacitance, and the like. Overly large interconnects result in less insulator, etc., separating proximate interconnects thereby increasing the likelihood of such deleterious effects. In view of such factors, and others, the critical dimension(s) for the interconnect are determined.

At 2220, the location of the formed interconnect is determined. As described above, there are a plurality of deleterious effects that can result from an incorrectly placed interconnect with regard to the connector to be joined. Hence, it is preferred that the formation of the interconnect is self-aligning with regard to the conductor to be connected with.

At 2230, based upon the determined interconnect critical dimension(s) and location, a patterning layout for a first layer can be defined. The patterning line(s), to be formed in the first layer, can be defined such that a line width (e.g., FIG. 19, distance Y) correlates to a critical dimension of the interconnect to be formed.

At 2240, a patterning layout for a second layer can be defined. The patterning line(s) for the second layer, as with the first layer, can be defined such that a line width (e.g., FIG. 19, distance X) correlates to a critical dimension of the interconnect to be formed. As described herein, the layout of the patterning line of the second layer (e.g., FIG. 19, second hard mask, edges A and B) is aligned orthogonally opposed to the corresponding portion of the patterning line formed in the first layer (e.g., FIG. 19, second hard mask, edges A and B), thereby forming a grating which acts to constrain the opening originally produced by the photolithographic process (e.g., opening 185).

At 2250, in accord with the determined pattern layout, the first layer is patterned using conventional technologies.

At 2260, patterning of the second layer can be conducted utilizing patterning techniques similar to those utilized for the first layer at 2250. As described above, the patterning of the second layer combines with the patterning of the first layer to effectively form a grating. The grating which acts to constrain the opening originally produced by the photolithographic process (e.g., opening 185), as shown in FIG. 18, where the opening created as a result of photolithography (e.g., opening 185) is larger than the opening (e.g., opening 180) formed as a result of the interaction of respective lines in the first hard mask (e.g., first hard mask 140) and the lines formed in the second hard mask (e.g., second hard mask 160).

Figure 23:
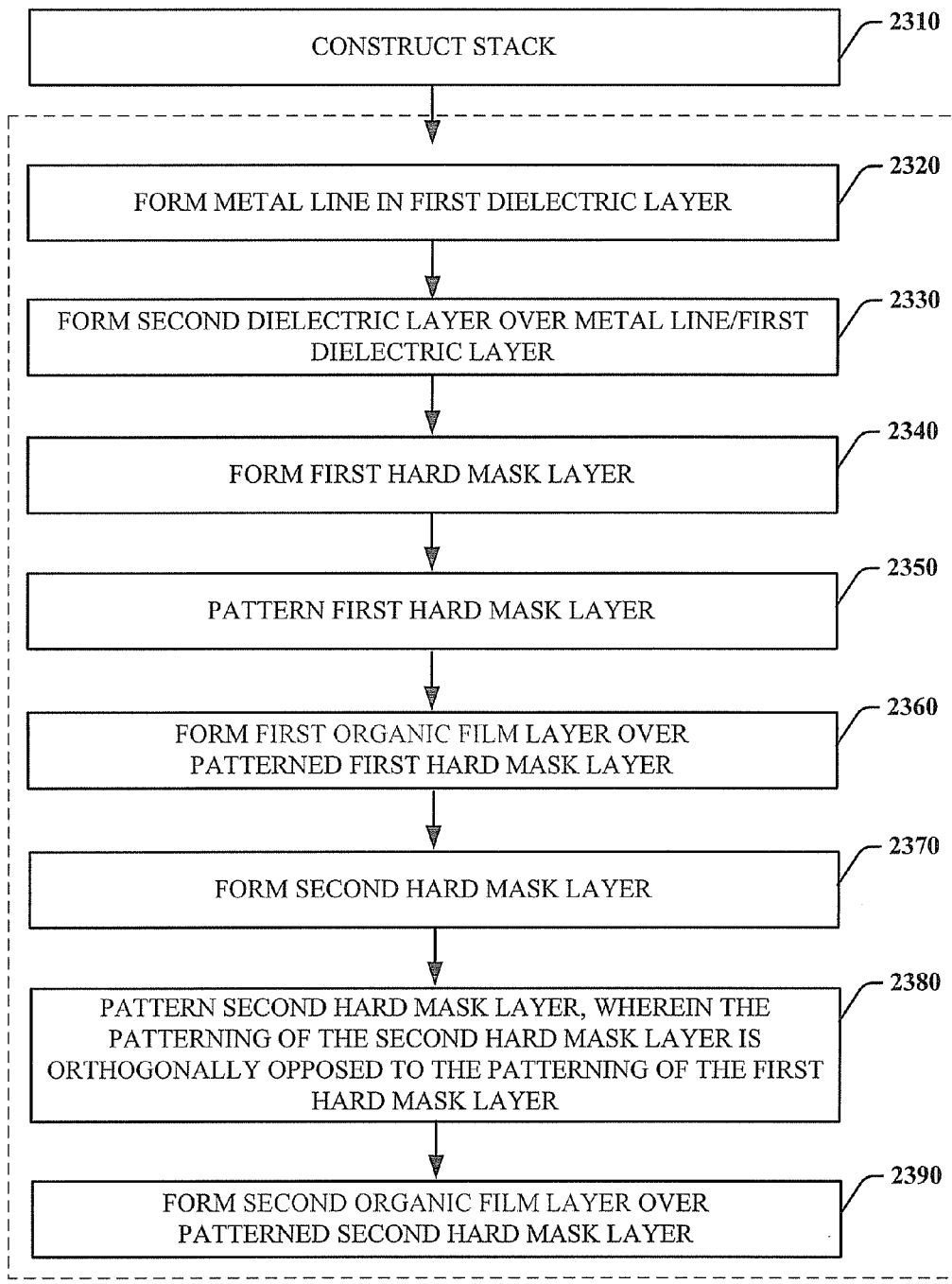
FIG. 23 illustrates a flow for constructing a semiconductor stack during formation of a via opening in accordance with one or more embodiments of the subject innovation.
Figure 24:
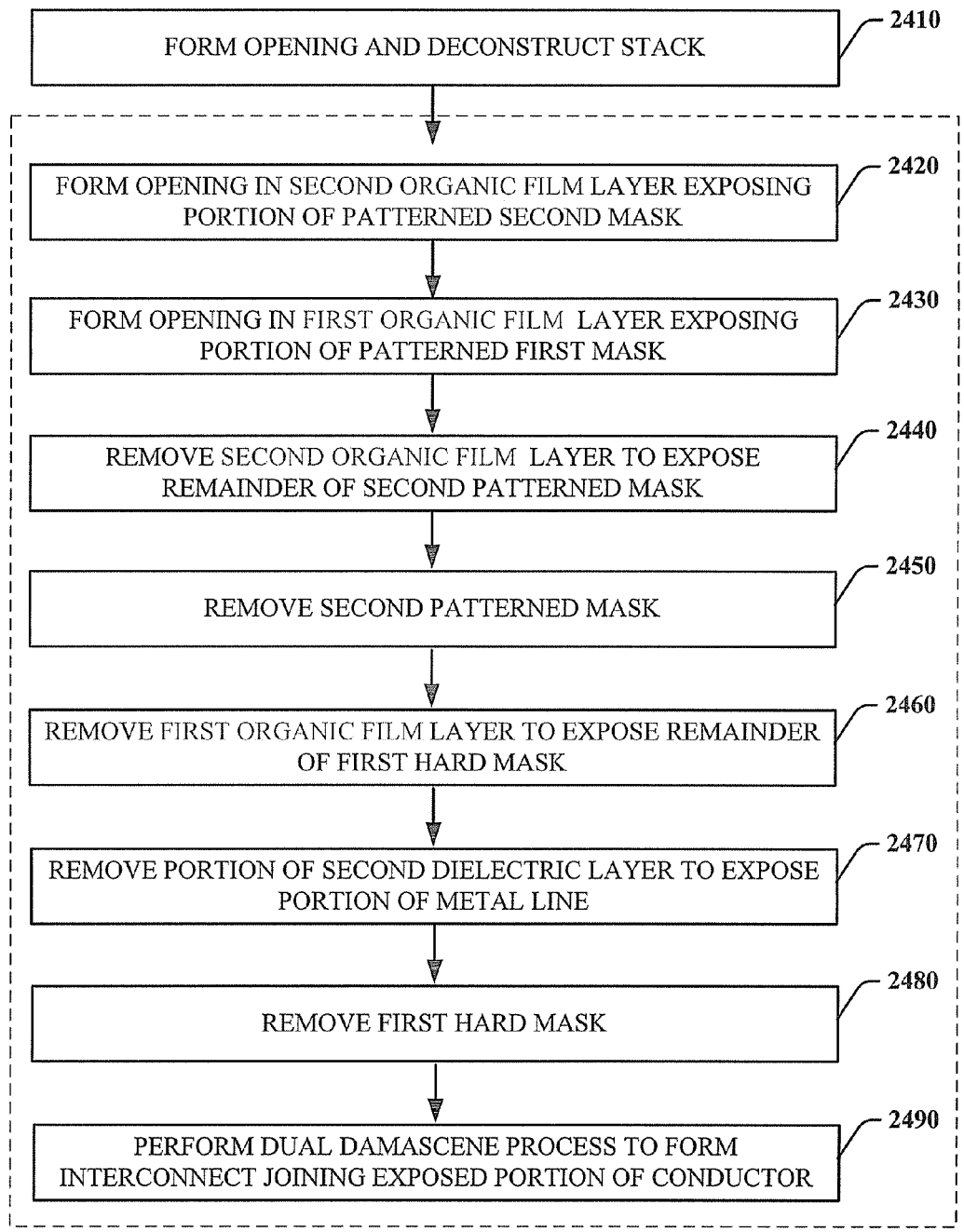
FIG. 24 illustrates a flow for deconstructing a semiconductor stack and formation of a via opening in accordance with one or more embodiments of the subject innovation.

FIGS. 23 and 24 present flow diagrams illustrating an exemplary, non-limiting embodiment for forming an interconnect in an integrated circuit structure. FIGS. 23 and 24 combine to show the respective aspects of constructing a stack comprising the various layers involved in forming a self-aligning interconnect having a critical dimension, and the deconstruction of the stack during formation of the opening from which the interconnect will be formed.

Referring initially to FIG. 23, construction of the stack is depicted. To aid understanding, the various acts presented in FIG. 23 are best interpreted with the various stages of stack construction presented in FIGS. 1-8. At 2310, construction of the stack is commenced. As described above, the stack can be formed on a substrate (e.g., substrate 100) where the substrate comprises a monocrystalline silicon wafer substrate or a pre-existing multilayer stack comprising a plurality of layers.

At 2320, a first dielectric layer (e.g., dielectric 110) is formed on the substrate and patterned to form a trench(es). A damascening process is applied to deposit metal (e.g., aluminum, copper, silver, etc.) into the trench(es) to form a metal line(s) (e.g., conductor 120). The combined layer of metal line(s) and first dielectric can be planarized to level the surface.

At 2330, a second dielectric layer (e.g., dielectric 130) is formed over the combined layer of metal line(s) and the first dielectric. As mentioned above, it is to be appreciated that the various materials selected to form the various layers (e.g., dielectric 110, 130, organic films 150, 170, first hard mask 140, second hard mask 160, etc.) can be chosen based upon their ability to be etched or resist etching by a particular etchant. In one aspect, materials forming adjacent layers are not able to be etched by a common etchant, while in another aspect materials forming adjacent layers are able to be etched by a common etchant. Hence, a method of removing material from one layer while leaving another layer intact, or removing material from both layers, or removing material from layers separated by intermediate layers, can be applied to selectively etch various layers singly or in combination.

At 2340, a first hard layer (e.g., first hard mask 140) is formed over the second dielectric layer, wherein the material selected for the first hard layer is based upon the etching selectivity of the material. In an exemplary, non-limiting embodiment, the material can be TiN.

At 2350, the first hard mask is patterned to form a line, wherein, as described above, the line is formed in accordance with a critical dimension of the interconnect desired to be formed, and the location of the interconnect with regard to the conductor which the interconnect will be formed.

At 2360, a first organic film layer (e.g., organic film 150) is formed over the patterned first hard mask.

At 2370, a second hard layer (e.g., second hard mask 160) is formed over the first organic film layer. As described above, the second hard layer can be comprised of a material having a high selectivity to etching, wherein such material can be TiN.

At 2380, the second hard mask is patterned to form a line, wherein, as described above, the line is formed in accordance with a critical dimension of the interconnect desired to be formed, and the location of the interconnect with regard to the conductor which the interconnect will be formed. The second hard mask is patterned with the line being aligned orthogonally opposed to the respective line formed in the first hard mask, thereby facilitating formation of a grating effect which acts to limit etching from a lithography process to an etching process forming an opening with dimensions equating to the desired critical dimensions and aligned (e.g., self-aligned) with the desired location on the conductor.

At 2390, a second organic film layer (e.g., organic film 170) is formed over the second mask layer.

Turning to FIG. 24, at 2410, an opening is formed into the stack and the stack is correspondingly deconstructed as the formation of the opening and interconnect proceeds, as described with acts 2420 to 2490.

At 2420, an opening (e.g., opening 180) is formed in the second organic film layer using conventional lithographic techniques to facilitate formation of the opening. Owing to conventional lithographic techniques being utilized the cross sectional area of the opening (e.g., dimension 185) is greater than the final desired critical dimension (footprint F2). Owing to the line in the second hard mask being narrower (e.g., is of the desired critical dimension) than the opening (e.g., dimension 185) being formed by the lithographic technique portions of the edges of the second hard mask are exposed.

At 2430, the opening is further extended by removal of material comprising the first organic film layer and thereby exposing portions of the edges of the first hard mask.

At 2440, the second organic film layer is removed thereby exposing the remainder of the patterned second hard mask.

At 2450, the patterned second hard mask is removed.

At 2460, the first organic film layer is removed to expose the remainder of the first hard mask.

At 2470, the opening is further extended by removing a portion of the second dielectric layer, thereby exposing a portion (e.g., footprint F2) of the conductor (e.g., conductor 120).

At 2480, the first hard mask is removed.

At 2490, a dual damascene process can be conducted to facilitate deposition of metal to form the interconnect in the opening and also to form any metal lines to be created in the second dielectric layer thereby forming a multilayer arrangement of metal lines and connectors.

Inversion Patterning

In a further exemplary, non-limiting embodiment, an issue of correct placement of the patterning is addressed. As described, correct placement of the mask patternings (e.g., for the first hard mask 140 and the second hard mask 160) facilitates both achievement of critical dimension(s) and location of the opening and the interconnect produced therefrom. As shown in FIG. 18, the patterning of the second hard mask 160 is the negative (or inversion) of the patterning of the metal line (conductor 120) patterning. Hence, common location datums (e.g., alignment marks) can be utilized for patterns employed to create the metal line patterning of conductor 120 and second hard mask 120.

Figure 25:
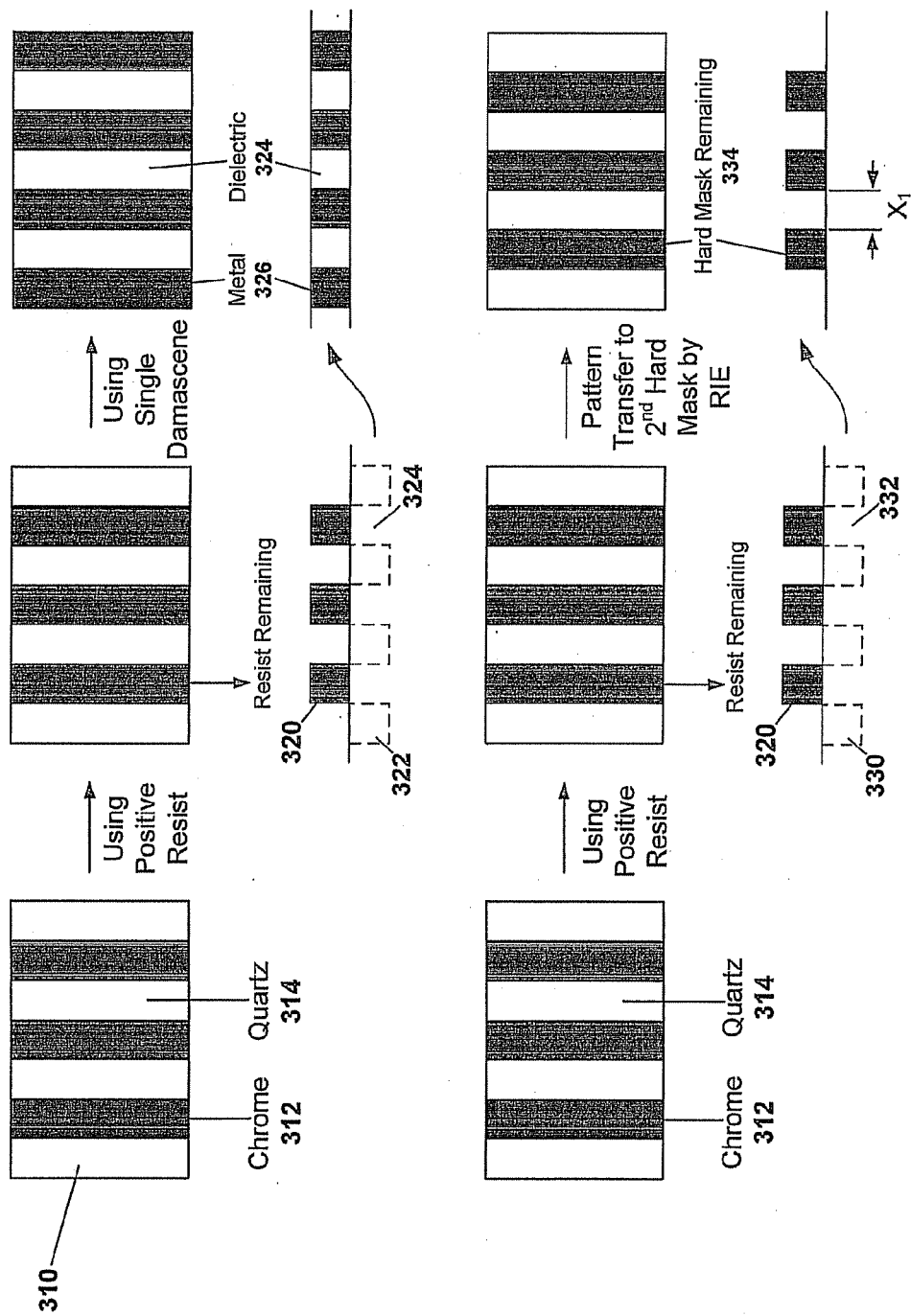
FIG. 25 illustrates patterning with a single mask pattern a plurality of surfaces according to one or more embodiments of the subject innovation

FIG. 25 illustrates an exemplary, non-limiting embodiment for utilization of a single mask to facilitate formation of metal line(s) (e.g., conductor 120) and the second hard mask (e.g., second hard mask 160). Mask 310 comprises regions of opaque material 312 (e.g., chrome) and translucent regions 314 (e.g., quartz), which when applied as part of photolithography of a positive resist, the regions of the photoresist not exposed to electromagnetic radiation, e.g., resist 320, owing to placement of opaque material 312, is not removed by etching (or other suitable forming process). Resist 320 is utilized to facilitate formation of troughs 322 in dielectric 324 (e.g., dielectric 110). A single damascene process can be performed whereby the trough(s) 322 are filled with a metal 326 (e.g., Cu), separated by dielectric region(s) 324.

The same mask 310 can be utilized to create the patterned second hard mask (e.g., second hard mask 160). Mask 310, including opaque regions 312 and translucent regions 314 can be utilized, as previously described, to form a patterned resist 320. Patterned resist 320 can be utilized to facilitate removal of material (patterning) of regions of hard mask 330, while leaving portions 332 unremoved. The unremoved portions 332, during creation of the second hard mask pattern by RIE create the patterned second hard mask regions 334 (e.g., second hard mask 160 as patterned in FIGS. 7, 17, 18 and 19).

As shown in FIG. 25, the second hard mask pattern 334 aligns directly with the metal lines 326 (e.g., conductor 120), enabling the second hard mask 334 to control the size of the opening (e.g., opening 180) formed with respect to metal lines during the creation of the self-aligned via, as described herein.

Further, as depicted in FIG. 25, the second hard mask pattern 334 is the inverse of metal line patterning 326. Hence, by simply creating a pattern 310 for the metal line patterning, and fabricating an inverted resist pattern 320 for creation of the second hard mask pattern, width $X_1$ (see corresponding X, FIG. 19) for patterning the second hard mask 160, is readily provided in relation to the conductor 120 to be joined by the interconnect. As shown on FIG. 25, in conjunction with FIGS. 18 and 19, critical dimension control in the X direction is provided by the opening width $X_1$ of the patterning (e.g., pattern 334) for the second hard mask 160. It is to be appreciated, that while not shown, a similar method of patterning with a first resist pattern and a second resist to form an inverted pattern, can be applied a plurality of times throughout construction and deconstruction of the stack. For example, as shown in FIG. 16, patterning has been applied as part of the formation of metal lines (e.g., conductor 190) in dielectric 130. Hence, an inversion of the resist pattern employed to create the metal lines can be employed to facilitate formation of a patterned hard mask which can be utilized to fabricate interconnect(s) in a subsequently formed layer to connect with conductors 190. Accordingly, by utilizing a process of inversion patterning an opening width $X_1$ is controlled by the second hard mask enabling overlay and critical dimension control specification(s) to be relaxed for via photolithography compared with a conventional process.

Figure 26:
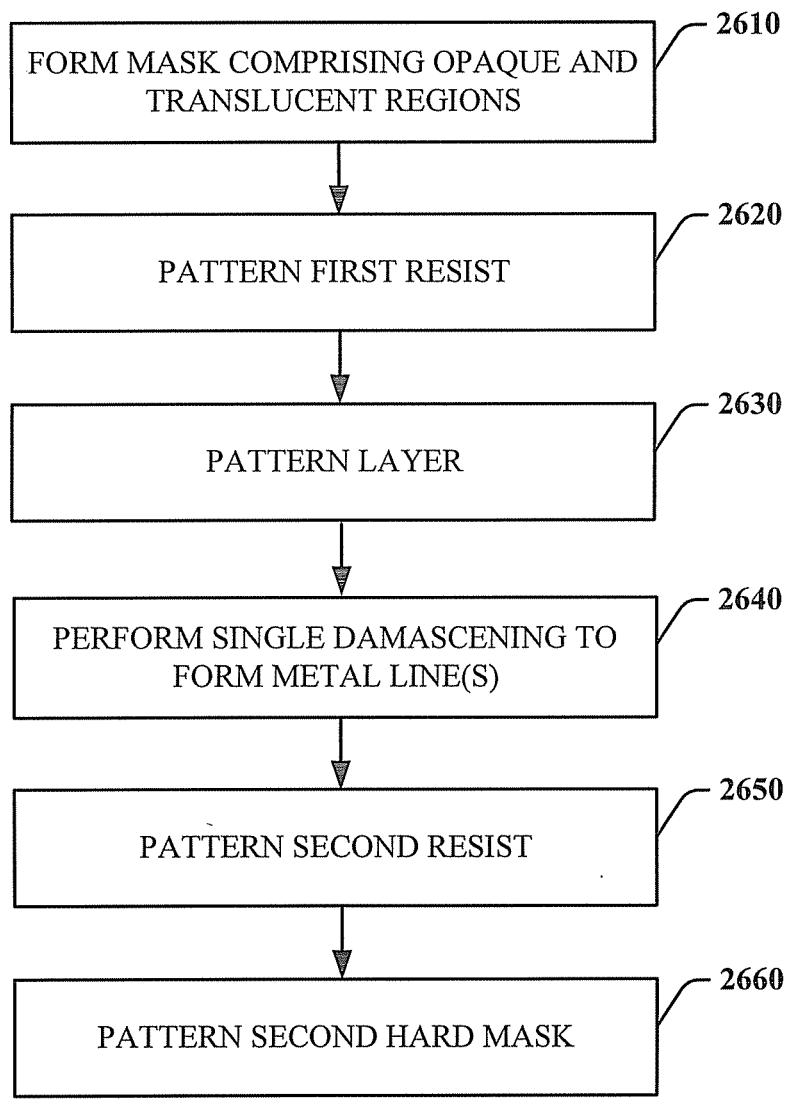
FIG. 26 illustrates a flow for patterning with a single mask pattern, a plurality of surfaces according to one or more embodiments of the subject innovation.

FIG. 26, presents a flow diagram illustrating an exemplary, non-limiting embodiment for generating patterns in forming an interconnect in an integrated circuit structure. At 2610, a pattern (e.g., pattern 310) is created to facilitate formations of the trough(s) into which metal is subsequently deposited for form metal lines (e.g., conductor 120).

At 2620, patterning of a first resist for forming the trough(s) is performed using the pattern.

At 2630, a layer (e.g., dielectric 110) is patterned in conjunction with the patterned first resist, wherein the patterning forms the trough(s) in the layer.

At 2640, a single damascene process is performed to fill the trough(s) with conductor (e.g., conductor 120) to facilitate formation of metal line(s) in the layer (e.g., dielectric 110).

At 2650, patterning of a second resist is conducted with the pattern.

At 2660, a hard mask is patterned with the second resist pattern to facilitate patterning of the hard mask layer (e.g., second hard mask layer 160) which can be utilized in guiding the formation of an opening by constraining material removed by an etching process.

Figure 27:
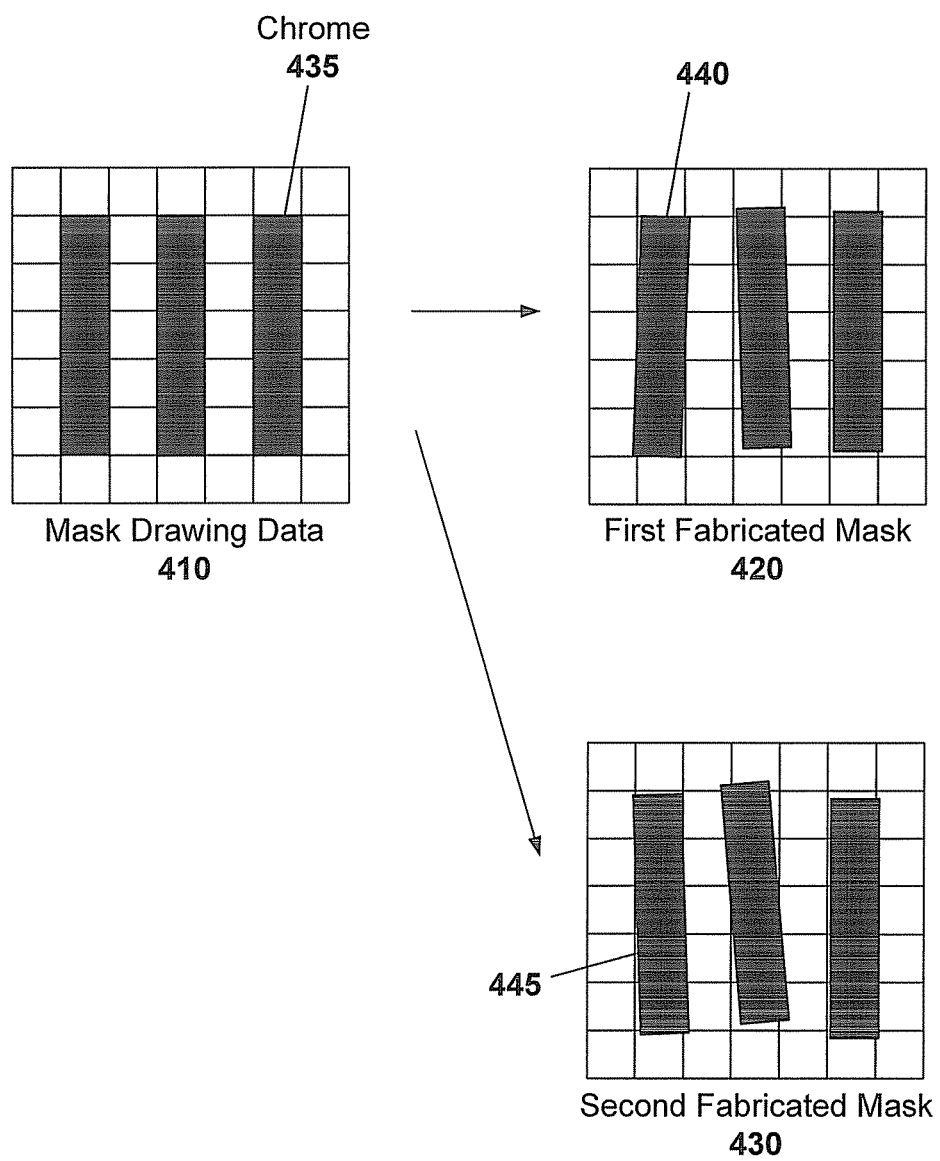
FIG. 27 illustrates an issue of "image placement error" which can be addressed by exemplary, non-limiting embodiments as disclosed herein.

FIG. 27 illustrates an issue of "image placement error" which can be addressed by exemplary, non-limiting embodiments as disclosed herein. A pattern drawing 410 is generated which can be utilized to facilitate formation of a plurality of masks. However, during fabrication of each mask "image placement error" occurs which (while illustrated with great exaggeration in FIG. 27) can result in a plurality of masks, 420 and 430, being created with differing degrees of offset (wherein the offset can be in the nanometer range). As shown in FIG. 27, the first fabricated mask 420 has chrome regions 440 offset to chrome regions 445 of second fabricated mask 430. Such image placement error during fabrication of each mask can occur for each mask incidence (e.g., masks 420 and 430), where the random error in image placement can become a source of non-correctable overlay error. As shown in FIG. 25, a single mask 310 can be utilized to facilitate formation of metal lines 326 and also formation of second hard mask 334, thereby minimizing, or negating, the degree of image placement error in comparison with a fabrication process where separate masks are utilized to facilitate respective formation of metal lines (e.g., conductor 120) and second hard mask (e.g., second hard mask 160).

What has been described above includes examples of the disclosed innovation. It is, of course, not possible to describe every conceivable combination of components or methodologies for purposes of describing the disclosed innovation, but one of ordinary skill in the art can recognize that many further combinations and permutations of the disclosed innovation are possible. Accordingly, the disclosed innovation is intended to embrace all such alterations, modifications and variations that fall within the spirit and scope of the appended claims. Furthermore, to the extent that the term "contain," "includes," "has," "involve," or variants thereof is used in either the detailed description or the claims, such term can be inclusive in a manner similar to the term "comprising" as "comprising" is interpreted when employed as a transitional word in a claim.

With respect to any figure or numerical range for a given characteristic, a figure or a parameter from one range may be combined with another figure or a parameter from a different range for the same characteristic to generate a numerical range.

Other than in the operating examples, or where otherwise indicated, all numbers, values and/or expressions referring to quantities of ingredients, reaction conditions, etc., used in the specification and claims are to be understood as modified in all instances by the term "about."

Further, while certain embodiments have been described above, it is to be appreciated that these embodiments have been presented by way of example only, and are not intended to limit the scope of the claimed subject matter. Indeed, the novel methods and devices described herein may be made without departing from the spirit of the above description. The accompanying claims and their equivalents are intended to cover such forms or modifications as would fall within the scope and spirit of the subject innovation.

In addition, it should be appreciated that while the respective methodologies provided above are shown and described as a series of acts for purposes of simplicity, such methodologies are not limited by the order of acts, as some acts can, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

What is claimed is:

1. A method for forming an opening in a semiconductor device, comprising:
    patterning a first hard mask layer with respect to a surface of a conductor;
    patterning a second hard mask layer with respect to the surface of the conductor, wherein the second hard mask layer pattern is aligned orthogonally opposed to the first hard mask layer patterning to form a grating in a etching direction, wherein the second hard mask layer is provided in a higher layer than the first hard mask layer with respect to the surface of the conductor; and
    controlling, with the grating, an etching process for exposing the surface of the conductor,
    wherein the patterning of the second hard mask layer is an inversion of the patterning utilized in forming of the conductor.

2. The method of claim 1, wherein the grating has a dimension corresponding to a critical dimension.

3. The method of claim 1, wherein the grating is of a dimension unachievable by a conventional photolithographic process.

4. The method of claim 1, wherein at least one of the first hard mask layer or the second hard mask layer comprising titanium nitride.

5. The method of claim 1, wherein both the first hard mask layer or the second hard mask layer comprise titanium nitride.

6. The method of claim 1, the etching operation further comprising selective etching.

7. A method for forming an opening in a semiconductor device, comprising:
    patterning a first hard mask layer with respect to a surface of a conductor;
    patterning a second hard mask layer with respect to the surface of the conductor, wherein the second hard mask layer pattern is aligned orthogonally opposed to the first hard mask layer patterning to form a grating in a etching direction; and
    controlling, with the grating, an etching process for exposing the surface of the conductor, removing, by selective anisotropic etching, a first underlying layer formed on the patterned second hard mask layer and exposing a portion of the second hard mask layer patterning.

8. The method of claim 7, further comprising removing, by selective anisotropic etching, a second underlying layer formed between the patterned second hard mask layer and the pattern first hard mask layer and exposing a portion of the first hard mask layer patterning.

9. The method of claim 8, further comprising removing, by selective anisotropic etching, a third underlying layer formed between the patterned first hard mask layer and the conductor exposing a portion of the surface of the conductor.

10. The method of claim 9, wherein the controlling of the etching process with the grating further involving constraining removal of at least one of the first underlying layer, the second underlying layer, or the third underlying layer, with at least one of the exposed portion of the patterned second hard mask layer or the exposed portion of the patterned first hard mask layer.

* * * * *